(12) United States Patent
Sasajima et al.

(10) Patent No.: US 7,891,975 B2
(45) Date of Patent: Feb. 22, 2011

(54) HEAT TREATMENT APPARATUS AND METHOD OF MANUFACTURING SUBSTRATE

(75) Inventors: Ryota Sasajima, Toyama (JP); Iwao Nakamura, Toyama (JP); Akira Morohashi, Toyama (JP); Ryuji Yamamoto, Kodaira (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 1066 days.

(21) Appl. No.: 11/658,160

(22) PCT Filed: Aug. 1, 2005

(86) PCT No.: PCT/JP2005/014016
§ 371 (c)(1),
(2), (4) Date: Jan. 23, 2007

(87) PCT Pub. No.: WO2006/013808
PCT Pub. Date: Feb. 9, 2006

(65) Prior Publication Data
US 2007/0297876 A1    Dec. 27, 2007

(30) Foreign Application Priority Data
Aug. 6, 2004  (JP) .............................. 2004-230135
Jan. 14, 2005  (JP) .............................. 2005-007278

(51) Int. Cl.
*F27D 5/00* (2006.01)
(52) U.S. Cl. ..................................... 432/259; 211/41.18
(58) Field of Classification Search ................ 432/253, 432/258, 259; 211/41.18; 148/527
See application file for complete search history.

(56) References Cited

U.S. PATENT DOCUMENTS

| | | | | |
|---|---|---|---|---|
| 5,586,880 | A * | 12/1996 | Ohsawa ...................... | 432/241 |
| 6,099,302 | A * | 8/2000 | Hong et al. ................. | 432/259 |
| 6,280,183 | B1 * | 8/2001 | Mayur et al. ................ | 432/258 |
| 6,474,987 | B1 * | 11/2002 | Nakai et al. ................. | 432/258 |
| 6,796,439 | B2 * | 9/2004 | Araki ....................... | 211/41.18 |
| 7,204,887 | B2 * | 4/2007 | Kawamura et al. ......... | 118/725 |
| 7,210,925 | B2 * | 5/2007 | Adachi ...................... | 432/253 |
| 7,241,141 | B2 * | 7/2007 | Wedel ....................... | 432/258 |
| 7,329,947 | B2 * | 2/2008 | Adachi et al. .............. | 257/706 |

(Continued)

FOREIGN PATENT DOCUMENTS

JP          U-2-88233          7/1990

(Continued)

*Primary Examiner*—Gregory A Wilson
(74) *Attorney, Agent, or Firm*—Oliff & Berridge, PLC

(57) ABSTRACT

Heat treatment apparatus and a method of manufacturing a substrate are provided, in which drop of particles produced by a rubbing action between a support strip and a support member can be prevented. Heat treatment apparatus 10 has a reactor 40 for treating a substrate, and a support tool 30 for supporting the substrate 54 in the reactor 40. The support tool 30 has a support part 57 to be contacted to the substrate 54, and a support strip 67 for supporting the support part 57. A back of the support part 57 has a convex portion or a concave portion, and the back of the support part 54 is configured to be not contacted to an edge of the support strip 67, and contacted to a top of the support strip 67 at inner than the edge of the support strip 67.

14 Claims, 17 Drawing Sheets

U.S. PATENT DOCUMENTS

| | | | |
|---|---|---|---|
| 7,331,780 B2 * | 2/2008 | Adachi | 432/253 |
| 7,625,205 B2 * | 12/2009 | Sasajima et al. | 432/253 |
| 2003/0170583 A1 * | 9/2003 | Nakashima et al. | 432/241 |
| 2003/0186563 A1 | 10/2003 | Kobayashi et al. | |

FOREIGN PATENT DOCUMENTS

| | | |
|---|---|---|
| JP | A 2004-014829 | 1/2004 |
| JP | A 2004-047911 | 2/2004 |
| JP | A 2004-111781 | 4/2004 |
| JP | A 2004-214260 | 7/2004 |
| WO | WO 2004-030073 A1 | 4/2004 |

* cited by examiner (a)

TWEEZER INSERTION DERECTION (b)

HEAT TREATMENT APPARATUS AND METHOD OF MANUFACTURING SUBSTRATE

TECHNICAL FIELD

The present invention relates to heat treatment apparatus for heat treatment of a semiconductor wafer or a glass substrate, and a method of manufacturing the semiconductor wafer or the glass substrate.

BACKGROUND ART

A support tool in vertical heat treatment apparatus has been configured to have a vertical pair of endplates, and, for example, three struts being vertically arranged to be spanned between the two endplates, and a number of holding grooves being disposed in a longitudinal direction of the three struts at a constant interval and ditched to be opened facing one another, wherein a substrate is inserted between the holding grooves of the three struts, thereby a plurality of substrates are held in a horizontal position and in a line in a vertical direction with centers of them being aligned. However, in the support tool having such a configuration, since total weight of the substrates is supported only by the holding grooves at three points, there has been a problem that when thermal stress is suddenly applied to a substrate, crystal defects (slip) may occur, or the substrate may be warped due to tensile stress or empty weight stress between contact surfaces of the substrate and the holding grooves.

As a method of solving such a problem, there is a method in which the support tool includes a support member to be contacted to the substrate, and a support strip for supporting the support member, and the support member includes a silicon plate-like member (hereinafter, referred to as plate-structural support tool) having an area smaller than that of a flat surface of the substrate and a thickness larger than that of the substrate, thereby the total weight of the substrate are dispersed to reduce the tensile stress or the empty weight stress, so that occurrence of slip is suppressed (refer to patent literature 1).

[Patent literature 1]
WO2004/030073 pamphlet.

DISCLOSURE OF THE INVENTION

Problems that the Invention is to Solve

However, in the plate-structural support tool, while a sufficient effect can be confirmed for suppressing the slip, in the case of sudden temperature change, such as a case of inserting the support tool into a heated treatment-chamber, a case of increasing substrate temperature to the heat treatment temperature, or a case of performing heat treatment to the substrates, particles may be deposited on a substrate situated downward for treatment.

The reason for this is considered to be because a rubbing action occurs between the support member and the support strip due to difference in thermal expansion coefficient between the support member including a plate using silicon as a base material, and the support strips including silicon carbide (SiC) for supporting the support member, and particles produced therein may drop on a surface of the substrate situated downward for treatment.

An object of the invention is to provide heat treatment apparatus and a method of manufacturing a substrate, in which drop of the particles produced by the rubbing action between the support member and the support strip can be prevented.

Means for Solving the Problems

A first feature of the invention is heat treatment apparatus having a reactor for treating a substrate, and a support tool for supporting the substrate in the reactor; wherein the support tool has a support part to be contacted to the substrate, and a support strip for supporting the support part, and a back of the support part has a convex portion or a concave portion, and the back of the support part is configured to be not contacted to an edge of the support strip, and contacted to a top of the support strip at inner than the edge of the support strip.

Preferably, the back of the support part has a convex portion which is configured in a way of being contacted to the top of the support strip at the inner side with respect to the edge of the support strip. Preferably, the back of the support part has a concave portion, and the concave portion is provided in a portion corresponding to the edge of the support part such that contact of the back of the support part to the edge of the support part is avoided. Furthermore, preferably, area of an opposed portion of the top of the support strip to the back of the support part (an overlapped portion of them in view from above) is equal to or smaller than area of the back of the support part. Furthermore, preferably, area of an opposed portion of the top of the support strip to the back of the support part (an overlapped portion of them in view from above) is smaller than area of the back of the support part. Preferably, the top of the support part has a concave portion, so that the support part is configured such that the substrate is not contacted to the edge of the support part, and contacted to the support part at inner than the edge of the support part, while the support part supports the substrate. Preferably, the support part includes a platelike member or a ring-like member. Preferably, the support tool is configured in a way of supporting a plurality of substrates in a plurality of stages with a space in an approximately horizontal condition. Furthermore, preferably, the support part includes one of silicon (Si), silicon carbide (SiC), and quartz; and the support strip includes one of silicon (Si), silicon carbide (SiC), and quartz. Furthermore, preferably, a material of the support part is the same as a material of the support strip. Furthermore, preferably, a material of the support part is different from a material of the support strip. Furthermore, preferably, the support part is made of silicon (Si), and the support strip is made of silicon carbide (SiC). Preferably, a treatment atmosphere in the reactor is an oxidizing atmosphere. Preferably, a concave portion is provided on the top of the support strip, the concave portion being for storing a convex portion provided in the back of the support part. Furthermore, preferably, a convex portion is provided on the top of the support strip, the convex portion being to be stored by a concave portion provided in the back of the support part. Preferably, the heat treatment apparatus has a reactor for treating a plurality of substrates, and a support tool for supporting the plurality of substrates in a plurality of stages in the reactor, wherein the support tool has a plurality of support parts to be contacted to the plurality of substrates respectively, and support strips for supporting the plurality of support parts in the plurality of stages, and a back of each of the support parts has a convex portion or a concave portion, and the back is configured to be not contacted to the edge of the support strip, and contacted to the top of the support strip at inner than the edge of the support strip.

A second feature of the invention is heat treatment apparatus having a reactor for treating a substrate, and a support tool for supporting the substrate in the reactor; wherein the support tool has a support part to be contacted to the substrate, and a support strip for supporting the support part, and area of a contact surface, at which the support part is contacted to the support strip, is smaller than area of an overlapped portion of the support part with the support strip in view in a vertical direction, and the contact surface is configured to be situated at inner than an edge of the support strip.

A third feature of the invention is heat treatment apparatus having a reactor for treating a substrate, and a support tool for supporting the substrate in the reactor; wherein the support tool has a support part to be contacted to the substrate, and a support strip for supporting the support part, and a back of the support part has a convex portion or a concave portion, and a top of the support strip has a concave portion for storing the convex portion of the back of the support part, or a convex portion to be stored by the concave portion of the back of the support part. Preferably, the concave portion or the convex portion of the top of the support strip is provided on the top of the support strip and at inner than an edge of the support strip.

A fourth feature of the invention is heat treatment apparatus having a reactor for treating a substrate, and a support tool for supporting the substrate in the reactor; wherein the support tool has a support part to be contacted to the substrate, and a support strip for supporting the support part, and a spacer is provided between a back of the support part and a top of the support strip, and at inner than an edge of the support strip, the spacer being to be contacted to both the back of the support part and the top of the support strip. Preferably, the spacer is contacted to the top of the support strip at the inner side with respect to the edge of the support strip without being contacted to the edge of the support strip. Furthermore, preferably, a concave portion for storing the spacer is provided in the back of the support part and the top of the support strip, or the back of the support part, or the top of the support strip.

A fifth feature of the invention is a method of manufacturing a substrate having a step of supporting a substrate by a support tool having a support part to be contacted to the substrate, and a support strip for supporting the support part, in which a back of the support part is not contacted to an edge of the support strip, and contacted to a top of the support strip at inner than the edge of the support strip; a step of carrying the substrate supported by the support tool into a reactor; a step of performing heat treatment to a substrate supported by the support tool in the reactor; and a step of carrying out the substrate supported by the support tool from the reactor after the heat treatment.

ADVANTAGE OF THE INVENTION

According to the invention, drop of the particles produced by the rubbing action between the support member and the support strip can be prevented.

Figure 1:
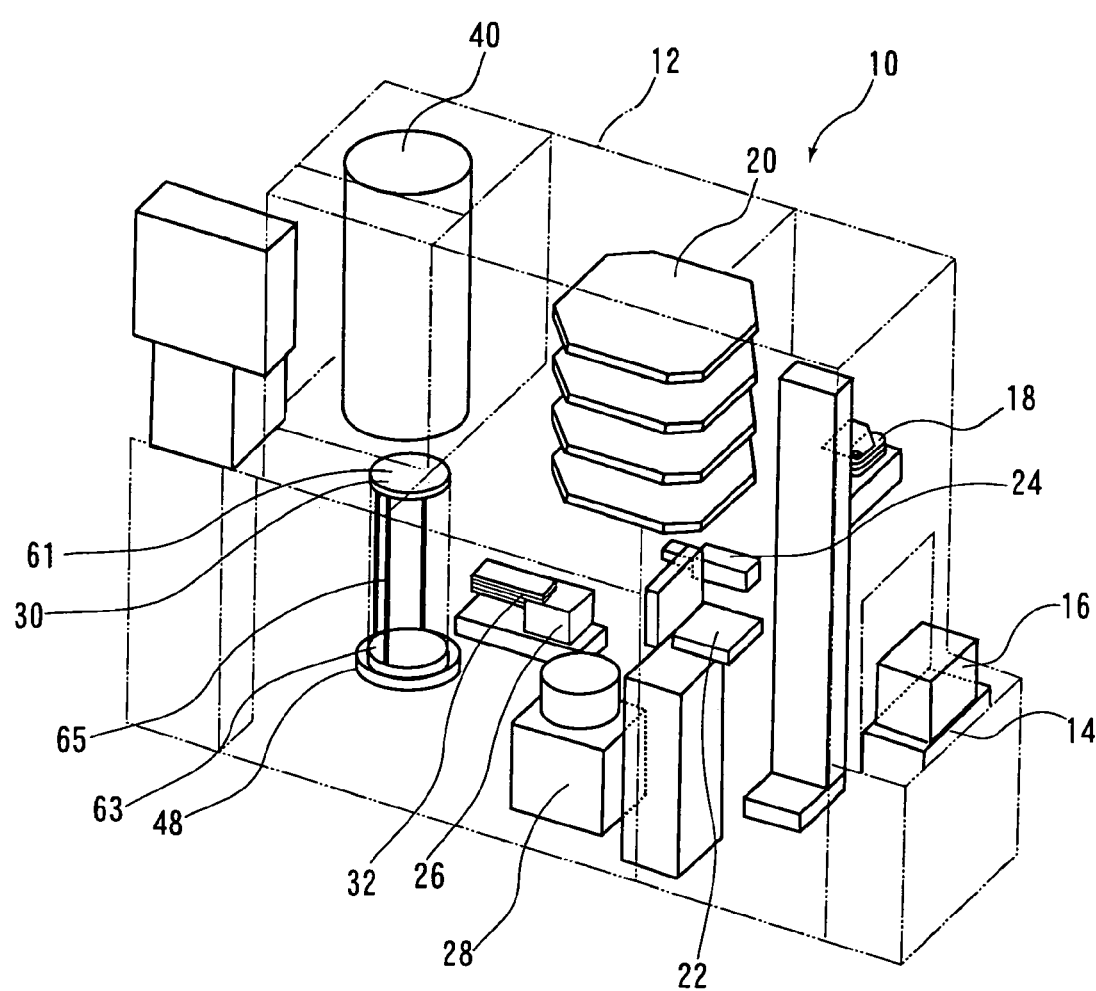
FIG. 1 is a schematic, perspective view showing heat treatment apparatus according to an embodiment of the invention.

DESCRIPTION OF THE REFERENCE NUMERALS AND SIGNS 10 heat treatment apparatus
12 housing
14 pod stage
16 pod
18 pod carrying device
20 pod shelf
22 pod opener
24 substrate number sensor
26 substrate transfer device
28 notch aligner
30 support tool 32 tweezer
40 reactor
42 reaction tube
43 reaction vessel
44 adaptor
46 heater
48 throat seal cap
50 second insulating member
52 first insulating member
54 substrate
56 gas supply port
57 body part
58 support part
58a convex portion
58b concave portion
58c facing
59 gas exhaust port
60 gas introduction pipe
61 upper plate
62 exhaust pipe
63 lower plate
64 gas introduction channel
65 strut
66 nozzle
67a support strip
67b convex portion
67c concave portion
74 spacer
76 through-hole
78 receiving part

BEST MODE FOR CARRYING OUT THE INVENTION

Next, a preferred embodiment of the invention will be described according to drawings.

FIG. 1 shows an example of heat treatment apparatus 10 according to the embodiment of the invention. The heat treatment apparatus 10 is, for example, batch-type vertical heat treatment apparatus, and has a housing 12 in which major parts are disposed. A pod stage 14 is connected to a front side of the housing 12, and the pod stage 14 carries a pod 16. The pod 16 stores, for example, 25 substrates, and is set on the pod stage 14 with a not-shown cap being closed.

A pod carrying device 18 is disposed at a front side in the housing 12 and in a position facing the pod stage 14. Near the pod carrying device 18, a pod shelf 20, pod opener 22, and substrate number sensor 24 are disposed. The pod shelf 20 is disposed above the pod opener 22, and the substrate number sensor 24 is disposed adjacently to the pod opener 22. The pod carrying device 18 carries the pod 16 among the pod stage 14, pod shelf 20, and pod opener 22. The pod opener 22 is to open the cap of the pod 16, and the number of substrates in the pod 16 with the cap being opened is sensed by the substrate number sensor 24.

Furthermore, a substrate transfer device 26, notch aligner 28, and support tool (boat) 30 are disposed in the housing 12. The substrate transfer device 26 has an arm (tweezer) 32 that can take out, for example, five substrates, and carries the substrates among the pod placed on a position of the pod opener 22, the notch aligner 28, and the support tool 30 by moving the arm 32. The notch aligner 28 is to detect notches or orientation flats formed in the substrates to arrange the notches or orientation flats of the substrates in a fixed position.

Furthermore, a reactor 40 is disposed in an upper portion at a back side in the housing 12. The support tool 30 loaded with a plurality of substrates is carried into the reactor 40 for heat treatment.

Figure 2:
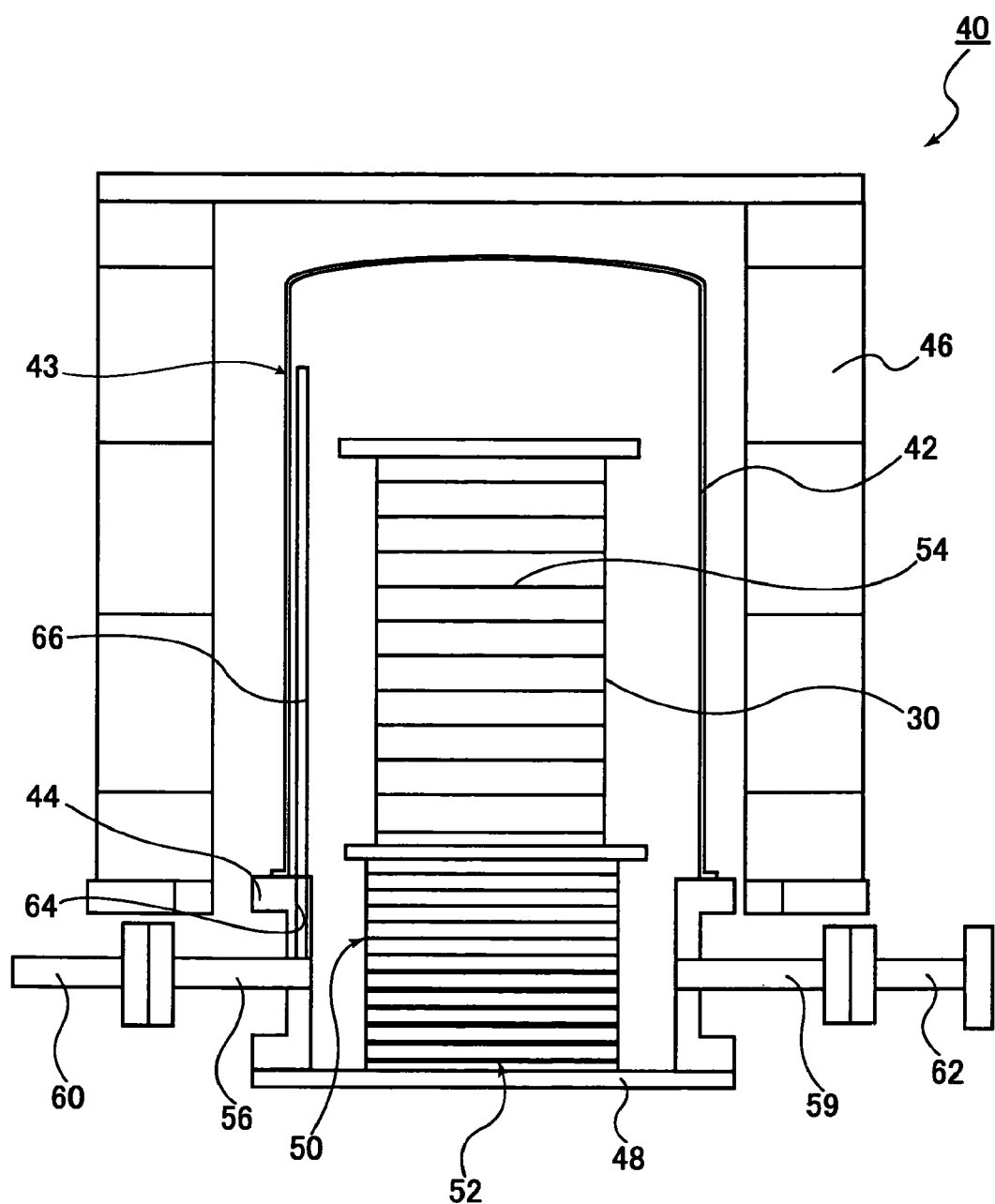
FIG. 2 is a cross section view showing a reactor used for the heat treatment apparatus according to the embodiment of the invention.

FIG. 2 shows an example of the reactor 40. The reactor 40 has a reaction tube 42 made of silicon carbide (SiC). The reaction tube 42 is in a cylindrical shape with an upper end being closed, and a lower end being opened, and the opened lower-end is formed in a flange shape. A quartz adapter 44 is disposed below the reaction tube 42 in a manner of supporting the reaction tube 42. The adapter 44 is in a cylindrical shape with upper and lower ends being opened, and the opened upper and lower ends are formed in a flange shape. A top of the upper-end flange of the adapter 44 is contacted with a bottom of the lower-end flange of the reaction tube 42. The reaction tube 42 and the adapter 44 form a reaction vessel 43. A heater 46 is disposed around the reaction tube 42 except for the adapter 44 in the reaction vessel 43.

A lower portion of the reaction vessel 43 formed by the reaction tube 42 and the adapter 44 is opened to insert the support tool 30, and such an opened portion (throat portion) is closed by contact of a throat seal cap 48 to the bottom of the lower-end flange of the adapter 44 with an O ring between them. The throat seal cap 48 supports the support tool 30, and provided in an up and down movable manner with the support tool 30. Between the throat seal cap 48 and the support tool 30, a first heat insulating member 52 made of quartz, and a second heat insulating member 52 made of silicon carbide (SiC) disposed on an upper part of the first heat insulating member 52 are provided. The support tool 30 supports a number of, for example, 25 to 100, substrates 54 in multiple stages with a space in an approximately horizontal condition, and loaded into the reaction tube 42.

To enable treatment at high temperature of 1200° C. of more, the reaction tube 42 is made of silicon carbide (SiC). When a structure is made, in which the SiC reaction tube 42 is extended to the throat portion, and the SiC throat portion is sealed by the throat seal cap 48 via an O ring, even a sealing portion is heated to high temperature by heat transferred via the SiC reaction tube 42, and consequently the O ring as a sealing material may be melted. When the sealing portion of the SiC reaction tube 42 is cooled to prevent melting the O ring, the SiC reaction tube 42 may be broken by difference in thermal expansion due to temperature difference. Thus, a heating region by the heater 46 in the reaction vessel 43 is configured by the SiC reaction tube 42, and a portion other than the heating region by the heater 46 is configured by a quartz adapter 44, thereby transfer of heat from the SiC reaction tube 42 is reduced, and consequently the throat portion can be sealed with avoiding melting the O ring, and breaking the reaction tube 42. Moreover, in sealing of the SiC reaction tube 42 and the SiC adapter 44, when profile irregularity of each is improved, temperature difference does not occur because the SiC reaction tube 42 is disposed in the heating region by the heater 46, consequently thermal expansion proceeds isotropically. Accordingly, a flange portion at the lower end portion of the SiC reaction tube 42 can be kept to be flat, consequently a space is not formed with respect to the adapter 44. Therefore, sealing performance can be secured only by placing the SiC reaction tube 42 on the quartz adapter 44.

In the adapter 44, a gas supply port 56 and a gas exhaust port 59 are formed integrally with the adapter 44. The gas supply port 56 is connected with a gas introduction tube 60, and a gas exhaust port 59 is connected with a gas exhaust tube 62, respectively. An inner wall of the adapter 44 is situated in an inner side (projected) compared with an inner wall of the adapter 44, and a side wall portion (thick portion) of the adapter 44 has a gas introduction channel 64 communicating with the gas supply port 56, and running in a vertical direction, and has a nozzle attachment hole in an upper part of the channel in a manner of opening upward. The nozzle attachment hole is opened in a top at a side of the upper-end flange of the adapter 44 within the reaction tube 42, and communicates with the gas supply port 56 and the gas introduction channel 64. A nozzle 66 is inserted into the nozzle attachment hole and fixed thereto. That is, the nozzle 66 is connected to a top of a portion of the adapter 44, the portion being projected inward with respect to the inner wall of the reaction tube 42 within the reaction tube 42, and the nozzle 66 is supported by the top of the adapter 44. According to such a configuration, a nozzle connection portion is hard to be thermally deformed, and hardly broken. Moreover, it provides a merit of facilitating assembly or dismantling of the nozzle 66 and the adapter 44. Treatment gas introduced from the gas introduction tube 60 to the gas supply port 56 is supplied into the reaction tube 42 via the gas introduction channel 64 and the nozzle 66 provided in the sidewall portion of the adapter 44. The nozzle 66 is configured to extend to the upside compared with an upper end of a substrate arrangement region (upside compared with an upper end of the support tool 30) along the inner wall of the reaction tube 42.

Next, operation of the heat treatment apparatus 10 configured as above is described.

First, when the pod 16 storing a plurality of substrates is set on the pod stage 14, the pod 16 is carried from the pod stage 14 to the pod shelf 20 by the pod carrying device 18, and stocked in the pod shelf 20. Then, the pod carrying device 18 carries the pod 16 stocked in the pod shelf 20 to the pod opener 22 and set it thereon, and then the pod opener 22 opens the cap of the pod 16, and then the substrate number sensor 24 senses the number of substrates stored in the pod 16.

Then, the substrate transfer device 26 takes out a substrate from the pod 16 situated on the pod opener 22, and transfers it to the notch aligner 28. The notch aligner 28 detects a notch while rotating the substrate, and aligns notches of the plurality of substrates in the same position based on detected information. Then, the substrate transfer device 26 takes out the substrate from the notch aligner 28, and transfers it into the support tool 30.

When substrates in the number corresponding to one batch have been transferred into the support tool 30 in this way, the support tool 30 loaded with a plurality of substrates 54 is loaded into the reactor 40 (into the reaction vessel 43) set at a temperature of, for example, about 600° C., and then the inside of the reactor 40 is sealed by the throat seal cap 48. Then, reactor temperature is increased to heat treatment temperature, and treatment gas is introduced from the gas introduction tube 60 into the reaction tube 42 via the gas introduction port 56, gas introduction channel 64 provided in the wall portion at an adapter 44 side, and nozzle 66. The treatment gas includes nitrogen ($N_2$), argon (Ar), hydrogen ($H_2$), and oxygen ($O_2$). When the substrates 54 are subjected to heat treatment, the substrates 54 are heated to a temperature of, for example, about 1200° C. or more.

After the heat treatment of the substrates 54 has been finished, the reactor temperature is decreased to a temperature of, for example, about 600° C., then the support tool 30 supporting the substrates 54 after heat treatment is unloaded from the reactor 40, and then the support tool 30 is waited in a predetermined position until all the substrates 54 supported by the support tool 30 are cooled. Then, when the substrates 54 in the waited support tool 30 are cooled to predetermined temperature, the substrate transfer device 26 takes out the substrates 54 from the support tool 30, and carries the substrates into an empty pod 16 set on the pod opener 22 to store them. Then, the pod carrying device 18 carries the pod 16 storing the substrates 54 to the pod shelf 20 or the pod stage 14, thereby the operation is completed.

Next, the support tool 30 is described in detail.

Figure 3:
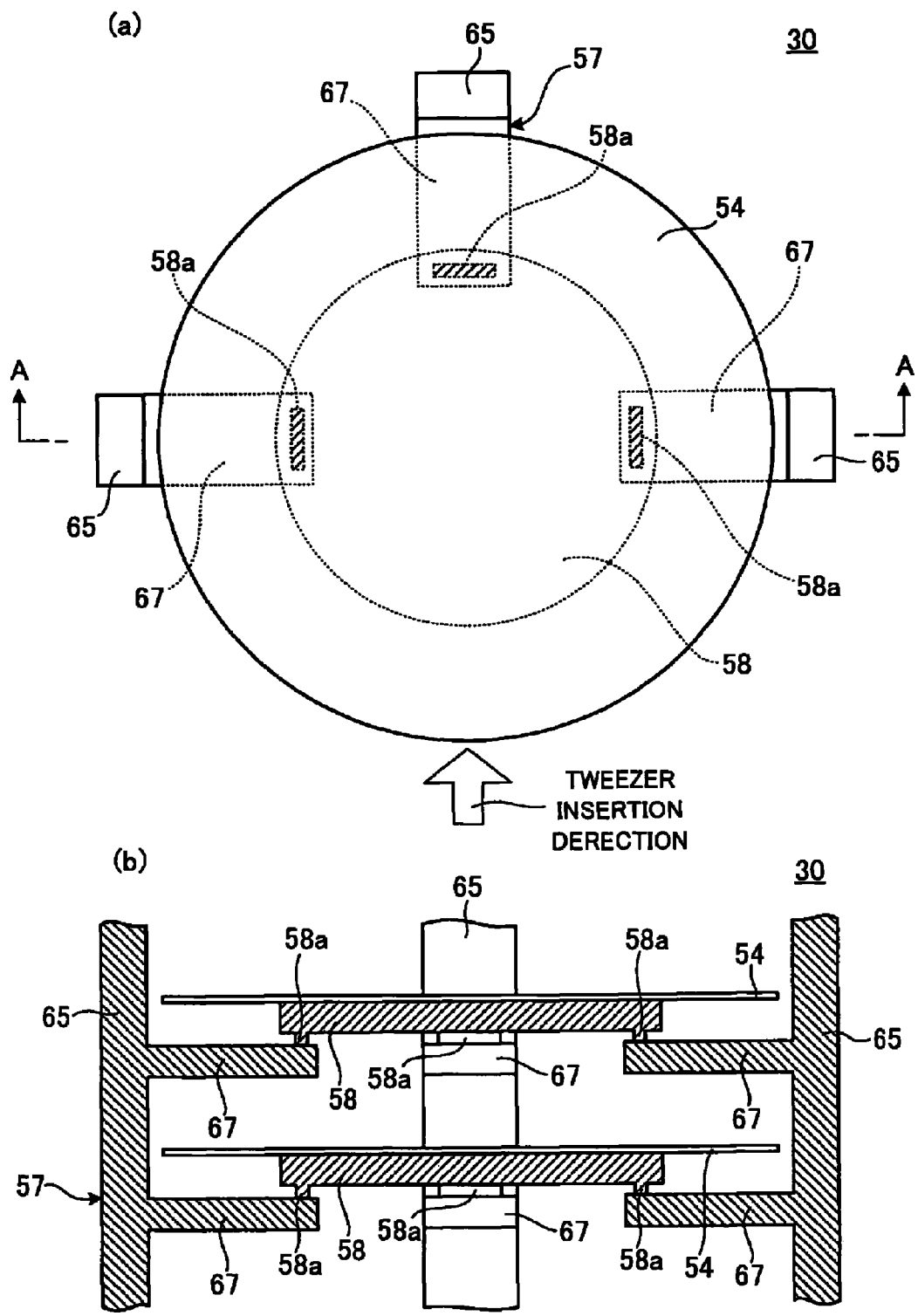
FIG. 3 is a view showing a substrate support tool according to the embodiment of the invention, wherein (a) is a plane view, and (b) is a cross section view along a line A-A.

FIG. 3 shows a schematic view of the support tool 30.

The support tool 30 includes a body part 57 and a support part 58. The body part 57 includes, for example, silicon carbide (SiC) or silicon impregnated silicon-carbide; and has a disk-like upper plate 61 (shown in FIG. 1), a similarly disk-like lower plate 63 (shown in FIG. 1), and, for example, three struts 65, 65, 65 connecting between the upper plate 61 and the lower plate 63, and support strips (claws) 67, 67, 67 extending from the struts 65, 65, 65. The struts 65, 65, 65 are formed with an interval of 90 degrees from one another, and two struts are provided with an interval of 180 degrees from each other at a tweezer 32 insertion side, and one strut is provided at a side opposite to the tweezer 32 insertion side. The support strips 67, 67, 67 extend from the struts 65, 65, 65 in a horizontal direction. The support strips 67, 67, 67 are formed in great numbers on the struts 65, 65, 65 with a constant interval in a vertical direction, and the platelike support parts 58 are supported in a horizontal position by the great number of support strips 67, 67, 67 respectively. The substrates 54 are supported on tops of the support parts 58 such that bottoms of the substrates 54 are contacted to the tops. That is, the body part 57 is configured such that it supports a plurality of support parts 58 in multiple stages with an interval in the horizontal position. According to such a configuration, the plurality of substrates 54 are supported in multiple stages with an interval in the horizontal position.

The support part 58 includes a platelike member, for example, made of silicon (Si), and is formed in a disk shape (cylinder shape). A shape of the support part is not necessarily the disk shape as in the embodiment, and can be configured to be in a ring shape or a horseshoe shape.

The diameter of the support part 58 is smaller than that of the substrate 54, that is, the top of the support part 58 has smaller area than that of a flat surface as the bottom of the substrate 54, and the substrate 54 is supported by the support part 58 with a circumferential edge of the substrate 54 being left (without being contacted to a circumferential edge portion of the substrate). The diameter of the substrate 54 is, for example, 300 mm, and in this case, the diameter of the support part 58 is preferably about 100 mm to 250 mm (about ⅓ to ⅚ of the outer diameter of the substrate). The diameter (area) of the support part 58 may be increased compared with the diameter (area) of the substrate 54. In this case, preferably, thickness of the support part 58 is further increased compared with thickness of the support part 58 described later.

Moreover, the support part 58 is formed to have larger thickness than that of the substrate 54. The thickness of the substrate 54 is, for example, 700 μm, and therefore the thickness of the support part 58 exceeds 700 μm, and can be increased to 10 mm, and preferably, it is at least twice the thickness of the substrate 54 or more, for example, 3 mm to 10 mm. The thickness of the support part 58 is larger than thickness of the support strips 67, 67, 67. The thickness of the support part 58 is set to be such thickness, thereby stiffness of the support part 58 can be increased, and consequently deformation of the support part 58 can be suppressed against temperature change during carrying in, carrying out, heating, cooling, and heat treatment of the substrate, and the like. Thus, occurrence of slip in the substrate 54 due to deformation of the support part 58 can be prevented. Moreover, since a material of the support part 58 is designed to be silicon as the same material as that of the substrate 54, that is, designed to be a material having the same thermal expansion coefficient or hardness as that of the silicon substrate 54, difference in thermal expansion or thermal compression between the substrate 54 and the support part 58 due to temperature change can be eliminated, and even if stress is produced at a contact point between the substrate 54 and the support part 58, the stress is easily released, therefore the substrate 54 is hardly scratched. Thus, occurrence of slip in the substrate 54 due to difference in thermal expansion or hardness between the substrate 54 and the support part 58 can be prevented.

An anti-adhesion layer for preventing adhesion of the support part 58 to the substrate 54 due to heat treatment is formed on the top (substrate setting surface) of the support part 58. The anti-adhesion layer is formed of a material having excellent heat resistance and wear resistance such as a silicon nitride (SiN) film, silicon carbide (SiC) film, silicon oxide (SiO$_2$) film, glassy carbon, and microcrystalline diamond, which are formed by treating a silicon surface or deposition on the silicon surface by CVD and the like.

The material of the support part 58 is preferably one of silicon (Si), silicon carbide (SiC), and quartz (SiO$_2$). Moreover, a material of the body part 57 (struts 65, support strips 67 and the like) is preferably one of silicon (Si), silicon carbide (SiC), and quartz (SiO$_2$). However, when heat treatment is performed at a temperature of 1200° C. or more, the material is preferably one of those other than quartz in the light of heat resistance.

When the material of the support part 58 is different from the material of the support strip 67, for example, when the support part 58 is made of silicon (Si), and the body part 57 is made of silicon carbide (SiC) as in the embodiment, the rubbing action may occur between the support part 58 and the support strip 67 due to difference in thermal expansion coefficient of them, consequently particles are easily produced. Accordingly, the invention may be effective in the case that the material of the support part 58 is different from the material of the support strip 67. However, even if the material of the support part 58 and the material of the support strip 67 are the same, when each has a different shape (thickness, width or the like), thermal expansion also proceeds in a different way, therefore the rubbing action may occur between the support part 58 and the support strip 67, consequently particles are produced. Accordingly, the invention may be also effective in the case that the material of the support part 58 and the material of the support strip 67 are the same.

Next, contact portions between the support part 58 and the support strips 67, 67, 67 are described using FIG. 3. As described before, FIG. 3(a) is a plane view of a part of the support tool 30, and FIG. 3(b) is a cross section view along a line A-A of FIG. 3(a).

As shown in FIG. 3, convex portions (projections) 58a, 58a, 58a are provided on the back (bottom) of the support part 58 in portions corresponding to the support strips (claws) 67, 67, 67. The convex portions 58a, 58a, 58a of the support part 58 are disposed such that they are not contacted to edges of the support strips 67, 67, 67, and contacted to the tops of the support strips 67, 67, 67 at inner sides with respect to the edges of the support strips 67, 67, 67. Here, the edges of the support strips 67, 67, 67 mean outer circumferential edges of the support strips 67, 67, 67 shown in FIG. 3, that is, visible outlines (profiles) of the support strips 67, 67, 67 in view in a vertical direction. Hereinafter, the term is used in the same meaning in this specification. That is, area of contact surfaces of contact portions of the backs of the support parts 58 (convex portions 58a, 58a, 58a) and the tops of the support strips 67, 67, 67 is smaller than area of overlapped portions of the support parts 58 with the support strips 67, 67, 67 in view in a vertical direction, and ends of the contact surfaces (outer circumferential edges of the contact surfaces) are situated at inner sides with respect to the edges of the support strips 67, 67, 67. Hatching areas in FIG. 3(a) indicate the contact portions of the support part 58 (convex portions 58a, 58a, 58a) to the support strips 67, 67, 67.

According to such a structure, the support part 58 is not contacted to the edges of the support strips 67, 67, 67, and contacted to the support strips 67, 67, 67 at the inner sides with respect to the edges of the support strips 67, 67, 67. Consequently, even if the particles are produced by the rubbing action between the convex portions 58a, 58a, 58a of the support part 58 and the tops of the support strips 67, 67, 67, the particles are received by the tops of the support strips 67, 67, 67. That is, the ends of the contact surfaces of the contact portions between the convex portions 58a, 58a, 58a of the support part 58 and the support strips 67, 67, 67 are situated at the inner sides with respect to the edges of the support strips 67, 67, 67, thereby particles produced in the contact portions are left and adhered on surfaces of the support strips 67, 67, 67 from the ends of the contact surfaces to the edges of the support strips 67, 67, 67. Therefore, produced particles can be prevented from dropping onto a downward substrate 54. Furthermore, when a treatment atmosphere is an oxidizing atmosphere, and the body part 57 is made of SiC, particles remained on the support strips 67, 67, 67 during an oxidization process of the body part are unified with an oxide film formed on a surface of the body art 57, consequently secondary scattering can be suppressed.

In the embodiment, only the back of the support part 58 can be subjected to machining (for providing convex portions), and the tops of the support strips 67, 67, 67 need not be subjected to machining (for providing convex portions or concave portions). It is difficult to perform machining to the support strips 67, 67, 67, that is, the body part 57 of the support tool 30, and particularly difficult to provide convex portions in the support strips 67, 67, 67 (body part 57) made of silicon carbide (SiC) as in the embodiment. Therefore, even if machining can be performed, cost may be increased. On the contrary, the support part 58 can be comparatively easily subjected to machining such as providing convex portions or concave portions, particularly in the support part 58 made of silicon (Si) as in the embodiment. Therefore, production cost can be decreased, which may be economically (costly) advantageous.

In a method of preparing the support part 58 having the convex portions on its back, cutting is preferable for the preparation in view of securing flatness (accuracy). That is, it is preferable that areas to be the convex portions in the back of the support part 58 are left, and areas other than those areas are removed by cutting, so that the convex portions are formed on the back of the support part 58 in one. When the support part 58 having the convex portions on its back is prepared, concave portions as separated pieces can be attached on the back of the support part 58, however, in that case, there is a demerit that the flatness (accuracy) is hardly secured, causing cost increase.

Next, modifications are described according to FIGS. 4 to 15.

Figure 4:
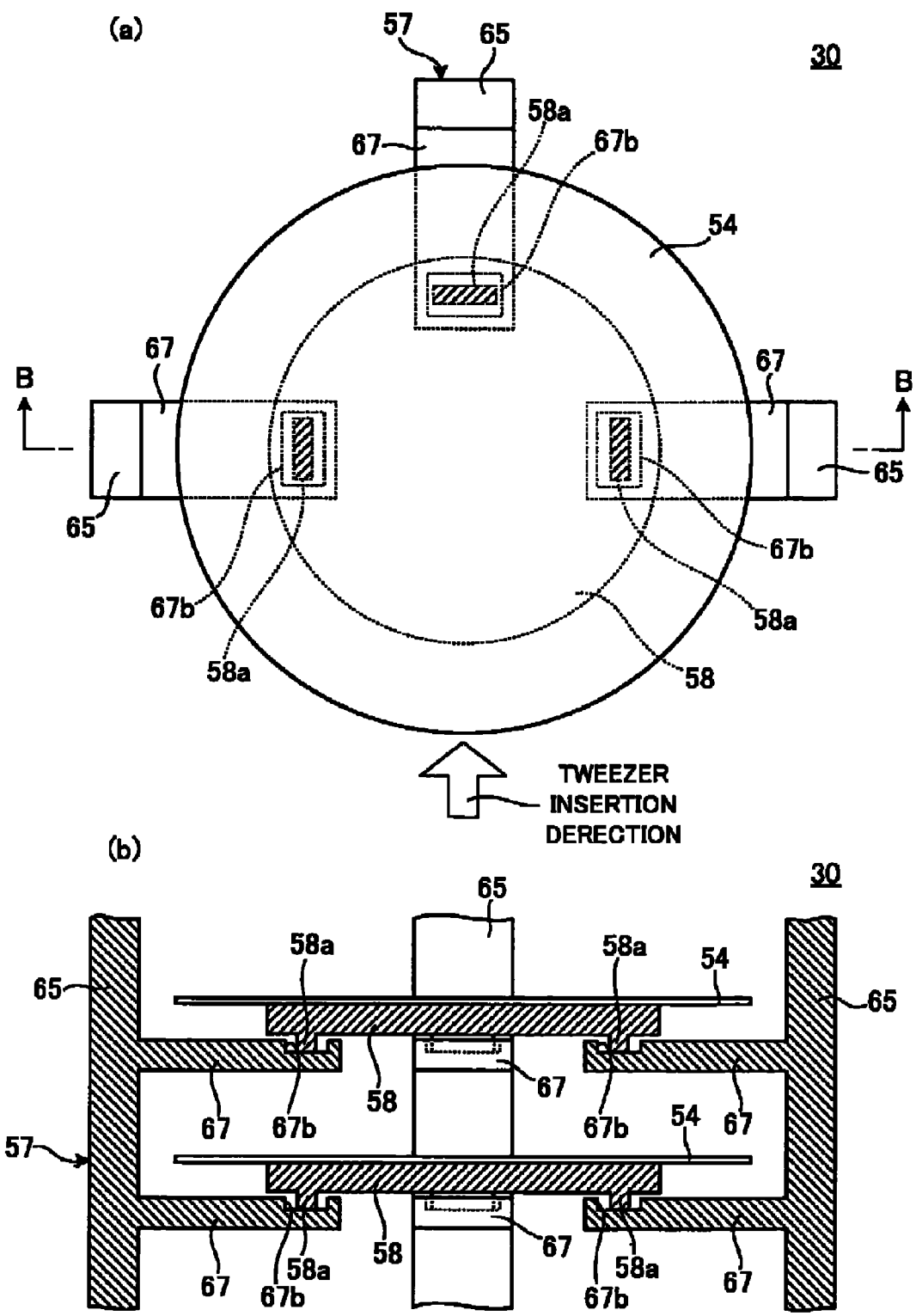
FIG. 4 is a view showing a substrate support tool (modification 1) according to the embodiment of the invention, wherein (a) is a plane view, and (b) is a cross section view along a line B-B.

FIG. 4 shows a schematic view of a support tool 30 of a first modification. FIG. 4(a) is a plane view of a part of the support tool 30, and FIG. 4(b) is a cross section view along a line B-B of FIG. 4(a).

As shown in FIG. 4, convex portions 58a, 58a, 58a are provided on a back (bottom) of a support part 58 in portions corresponding to support strips (claws) 67, 67, 67. Moreover, concave portions (grooves) 67b, 67b, 67b are provided on tops (surfaces) of support strips 67, 67, 67 and at inner than edges of the support strips 67, 67, 67 such that they are corresponding to the convex portions (projections) 58a, 58a, 58a of the support part 58, and the convex portions 58a, 58a, 58a of the support part 58 are stored in the concave portions 67b, 67b, 67b. Hatching areas in FIG. 4(*a*) indicate contact portions of the support part 58 (convex portions 58a, 58a, 58a) to the support strips 67, 67, 67 (concave portions 67b, 67b, 67b).

According to such a structure, the support part 58 is not contacted to the edges of the support strips 67, 67, 67, and contacted to the support strips 67, 67, 67 at the inner sides with respect to the edges of the support strips 67, 67, 67. Consequently, even if particles are produced by the rubbing action between the convex portions 58a, 58a, 58a of the support part 58 and the concave portions 67b, 67b, 67b of the support strips 67, 67, 67, the particles are received by the concave portions 67b, 67b, 67b of the support strips 67, 67, 67. Therefore, produced particles can be prevented from dropping onto a downward substrate 54. Moreover, since the received particles are stored in the concave portions 67b, 67b, 67b of the support strips 67, 67, 67, particles can be further prevented from dropping onto the substrate 54. Moreover, even if the support part 58 may be displaced with respect to the support strips 67, 67, 67, the convex portions 58a, 58a, 58a of the support part 58 are hooked by sidewalls of the concave portions 67b, 67b, 67b of the support strips 67, 67, 67, thereby motion of the support part 58 is restricted, therefore the support part 58 is not significantly displaced, in addition, do not drop from the support strips 67, 67, 67. In this way, the convex portions 58a, 58a, 58a of the support part 58 and the concave portions 67b, 67b, 67b of the support strips 67, 67, 67 can take a role of position restriction means of the support part 58, or a stopper.

Figure 5:
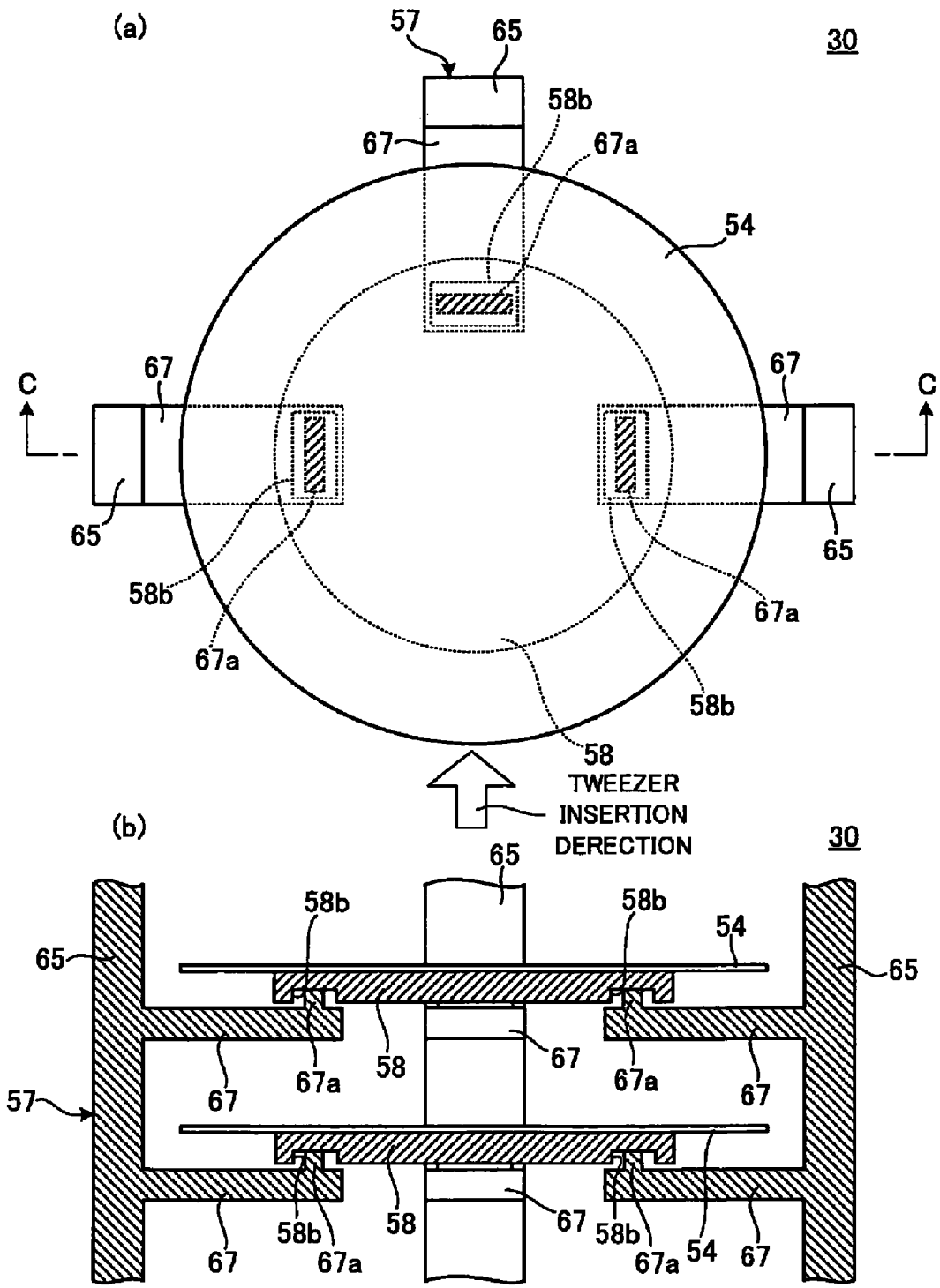
FIG. 5 is a view showing a substrate support tool (modification 2) according to the embodiment of the invention, wherein (a) is a plane view, and (b) is a cross section view along a line C-C.

Next, a second modification is described according to FIG. 5.

FIG. 5 shows a schematic view of a support tool 30 of the second modification. FIG. 5(*a*) is a plane view of a part of the support tool 30, and FIG. 5(*b*) is a cross section view along a line C-C of FIG. 5(*a*).

As shown in FIG. 5, convex portions 67a, 67a, 67a are provided on tops of support strips (claws) 67, 67, 67 and at inner than edges of the support strips 67, 67, 67. Concave portions (grooves) 58b, 58b, 58b are provided on a back of a support part 58 such that they are corresponding to the convex portions 67a, 67a, 67a of the support strips 67, 67, 67, and the convex portions 67a, 67a, 67a of the support strips 67, 67, 67 are stored in the concave portions 58b, 58b, 58b. Hatching areas in FIG. 5(*a*) indicate contact portions of the support part 58 (concave portions 58b, 58b, 58b) to the support strips 67, 67, 67 (convex portions 67a, 67a, 67a).

According to such a structure, the support part 58 is not contacted to the edges of the support strips 67, 67, 67, and contacted to the support strips 67, 67, 67 at the inner sides with respect to the edges of the support strips 67, 67, 67. Consequently, even if particles are produced by the rubbing action between the concave portions 58b, 58b, 58b of the support part 58 and the convex portions 67a, 67a, 67a of the support strips 67, 67, 67, the particles are received by the tops of the support strips 67, 67, 67. Therefore, produced particles can be prevented from dropping onto a downward substrate 54. Moreover, even if the support part 58 may be displaced with respect to the support strips 67, 67, 67, the convex portions 67a, 67a, 67a of the support strips 67, 67, 67 are hooked by sidewalls of the concave portions 58b, 58b, 58b of the support part 58, thereby motion of the support part 58 is restricted, therefore the support part 58 is not significantly displaced, in addition, do not drop from the support strips 67, 67, 67. In this way, the concave portions 58b, 58b, 58b of the support part 58 and the convex portions 67a, 67a, 67a of the support strips 67, 67, 67 can take a role of position restriction means of the support part 58, or a stopper.

Figure 6:
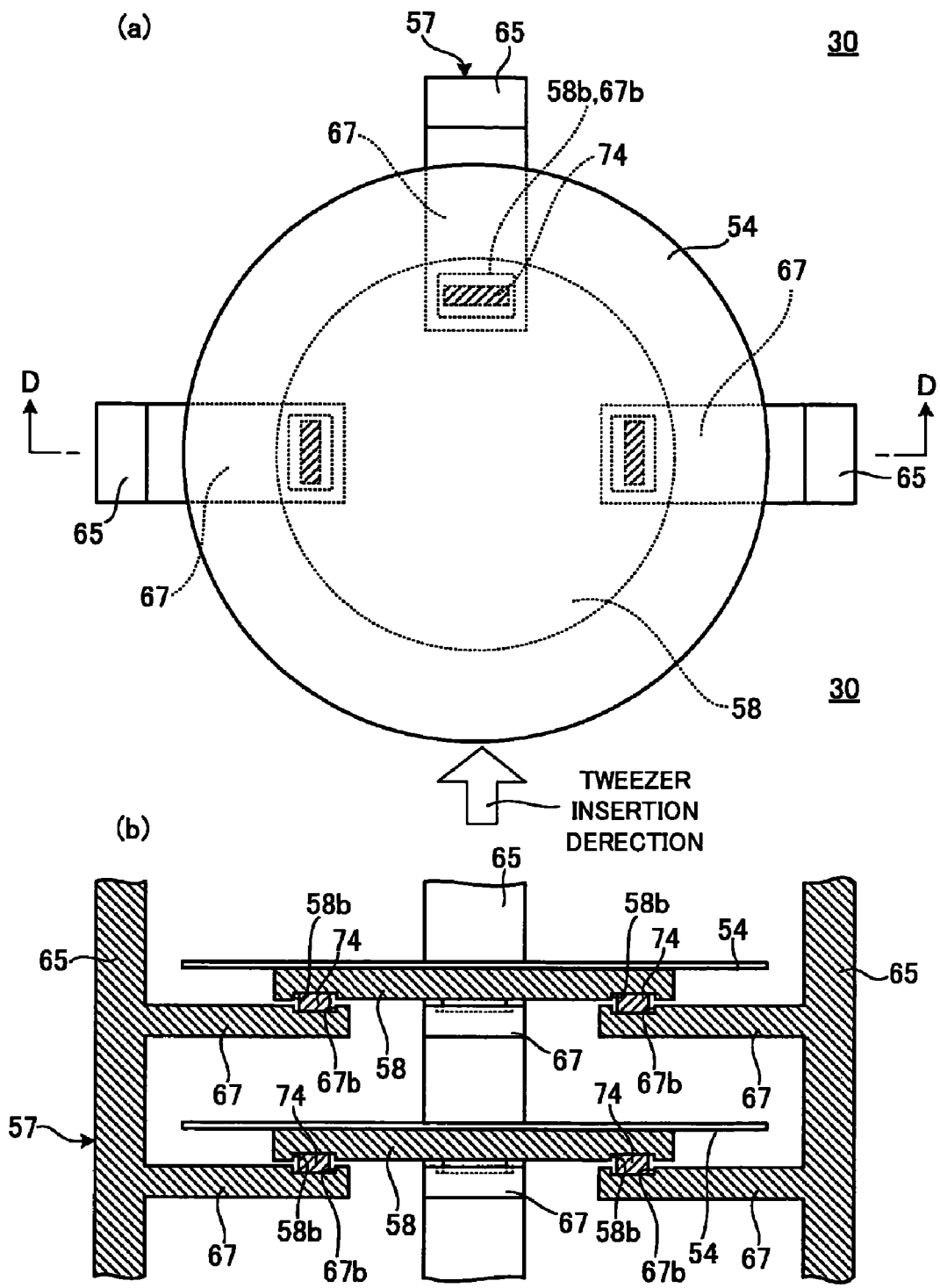
FIG. 6 is a view showing a substrate support tool (modification 3) according to the embodiment of the invention, wherein (a) is a plane view, and (b) is a cross section view along a line D-D.

Next, a third modification is described according to FIG. 6.

FIG. 6 shows a schematic view of a support tool 30 of the third modification. FIG. 6(*a*) is a plane view of a part of the support tool 30, and FIG. 6(*b*) is a cross section view along a line D-D of FIG. 6(*a*).

As shown in FIG. 6, spacers 74, 74, 74 are provided between a back of a support part 58 and tops of support strips (claws) 67, 67, 67, and at inner than edges of the support strips 67, 67, 67. The spacers 74, 74, 74 are disposed such that they are not contacted to edges of the support strips 67, 67, 67, and contacted to the tops of the support strips 67, 67, 67 at the inner side with respect to the edges of the support strips 67, 67, 67. The spacers 74, 74, 74 are formed of different members from a member of the support part 58 and a member of the support strips 67, 67, 67. A material of the spacers 74, 74, 74 is preferably one of silicon, silicon carbide, and quartz. However, when heat treatment is performed at a temperature of 1200° C. or more, one of materials other than quartz is preferably used. The spacers 74, 74, 74 are supported on the support strips 67, 67, 67, and the support part 58 is supported on the spacers 74, 74, 74. Concave portions (grooves) 67b, 67b, 67b are provided in the tops of the support strips 67, 67, 67, and at the inner side with respect to the edges of the support strips 67, 67, 67, such that the spacers 74, 74, 74 are stored in the concave portions 67b, 67b, 67b. Furthermore, concave portions (grooves) 58b, 58b, 58b are provided in portions of the back of the support part 58 corresponding to the support strips 67, 67, 67, and the spacers 74, 74, 74 are stored in the concave portions 58b, 58b, 58b. Height of the spacers 74, 74, 74 is larger than sum of depth of the concave portions 67b, 67b, 67b of the support strips 67, 67, 67 and depth of the concave portions 58b, 58b, 58b of the support part 58, so that a space is provided between the support part 58 and the support strips 67, 67, 67 to prevent direct contact between them. Hatching areas in FIG. 6(*a*) indicate contact portions between the support part 58 (concave portions 58b, 58b, 58b), the support strips 67, 67, 67 (convex portions 67b, 67b, 67b), and the spacers 74, 74, 74.

According to such a structure, even if particles are produced by the rubbing action between the concave portions 58b, 58b, 58b of the support part 58 or the concave portions 67b, 67b, 67b of the support strips 67, 67, 67 and the spacers 74, 74, 74, the particles are received by the concave portions 67b, 67b, 67b of the support strips 67, 67, 67. Therefore, produced particles can be prevented from dropping onto a downward substrate 54. Moreover, since received particles are stored in the concave portions 67b, 67b, 67b of the support strips 67, 67, 67, particles can be further prevented from dropping onto the substrate 54. Moreover, even if the support part 58 may be displaced with respect to the support strips 67, 67, 67, the spacers 74, 74, 74 are hooked by sidewalls of the concave portions 58b, 58b, 58b of the support part 58, and sidewalls of the concave portions 67b, 67b, 67b of the support strips 67, 67, 67, thereby motion of the support part 58 is restricted, therefore the support part 58 is not significantly displaced, in addition, do not drop from the support strips 67, 67, 67. In this way, the concave portions 58b, 58b, 58b of the support part 58, the concave portions 67b, 67b, 67b of the support strips 67, 67, 67, and the spacers 74, 74, 74 can take a role of position restriction means of the support part 58, or a stopper. While the concave portions were provided in both of the back of the support part 58 and the tops of the support strips 67, 67, 67, they may be provided in either one.

Figure 7:
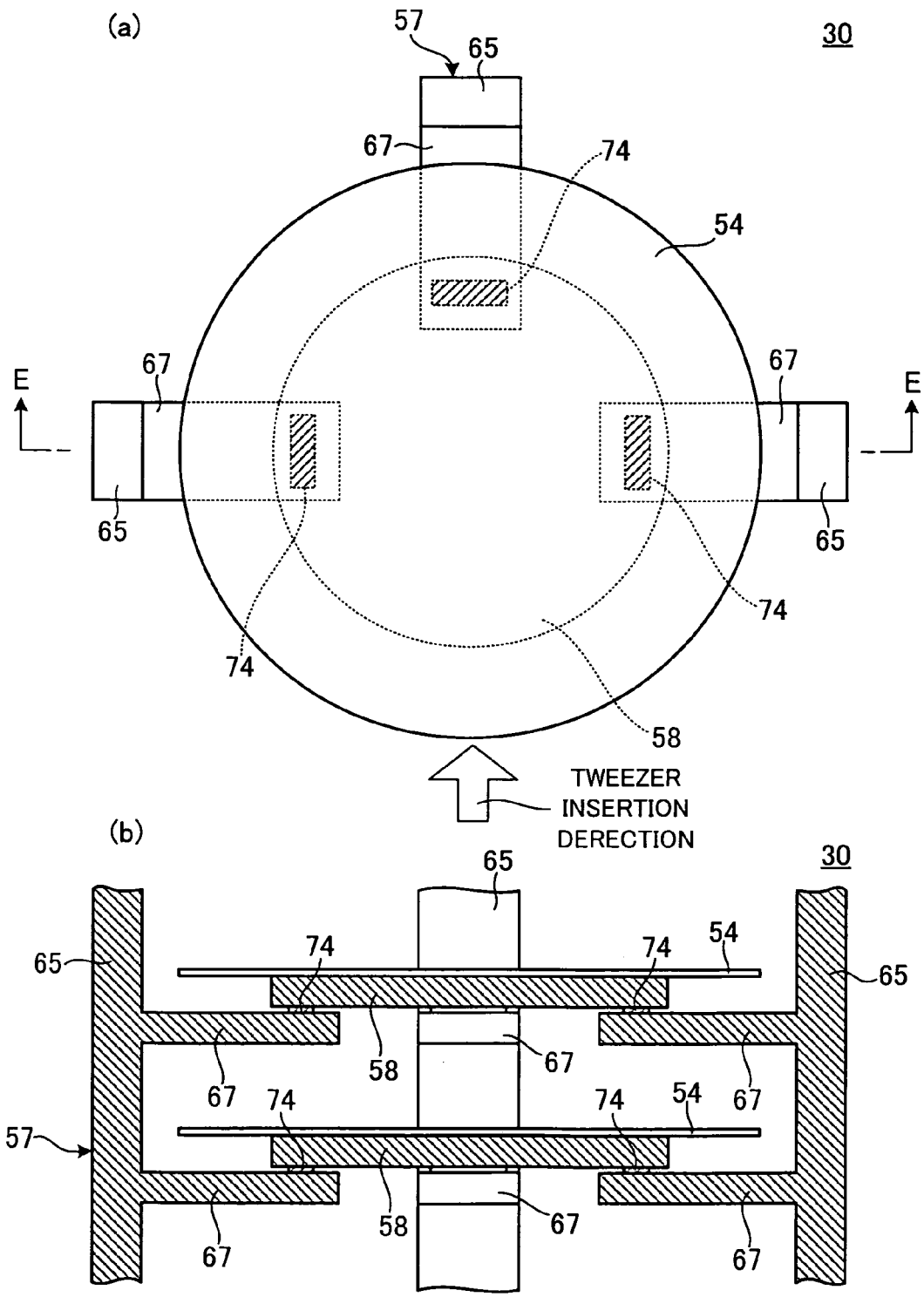
FIG. 7 is a view showing a substrate support tool (modification 4) according to the embodiment of the invention, wherein (a) is a plane view, and (b) is a cross section view along a line E-E.

Next, a fourth modification is described according to FIG. 7.

FIG. 7 shows a schematic view of a support tool 30 of the fourth modification. FIG. 7(*a*) is a plane view of a part of the support tool 30, and FIG. 7(*b*) is a cross section view along a line E-E of FIG. 7(*a*).

As shown in FIG. 7, spacers 74, 74, 74 are disposed between a back of a support part 58 and tops of support strips (claws) 67, 67, 67, and at inner than edges of the support strips 67, 67, 67. The spacers 74, 74, 74 are formed of different members from a member of the support part 58 and a member of the support strips 67, 67, 67. A material of the spacers 74, 74, 74 is preferably one of silicon, silicon carbide, and quartz. However, when heat treatment is performed at a temperature of 1200° C. or more, one of materials other than quartz is preferably used. The spacers 74, 74, 74 are supported on the support strips 67, 67, 67, and the support part 58 is supported on the spacers 74, 74, 74. The spacers 74, 74, 74 are disposed such that they are not contacted to the edges of the support strips 67, 67, 67, and contacted to the tops of the support strips 67, 67, 67 at the inner side with respect to the edges of the support strips 67, 67, 67. Hatching areas in FIG. 7(*a*) indicate contact portions between the support part 58, the support strips 67, 67, 67, and the spacers 74, 74, 74.

According to such a structure, even if particles are produced by the rubbing action between the back of the support part 58 or the tops of the support strips 67, 67, 67 and the spacers 74, 74, 74, the particles are received by the tops of the support strips 67, 67, 67. Therefore, produced particles can be prevented from dropping onto a downward substrate 54.

Figure 8:
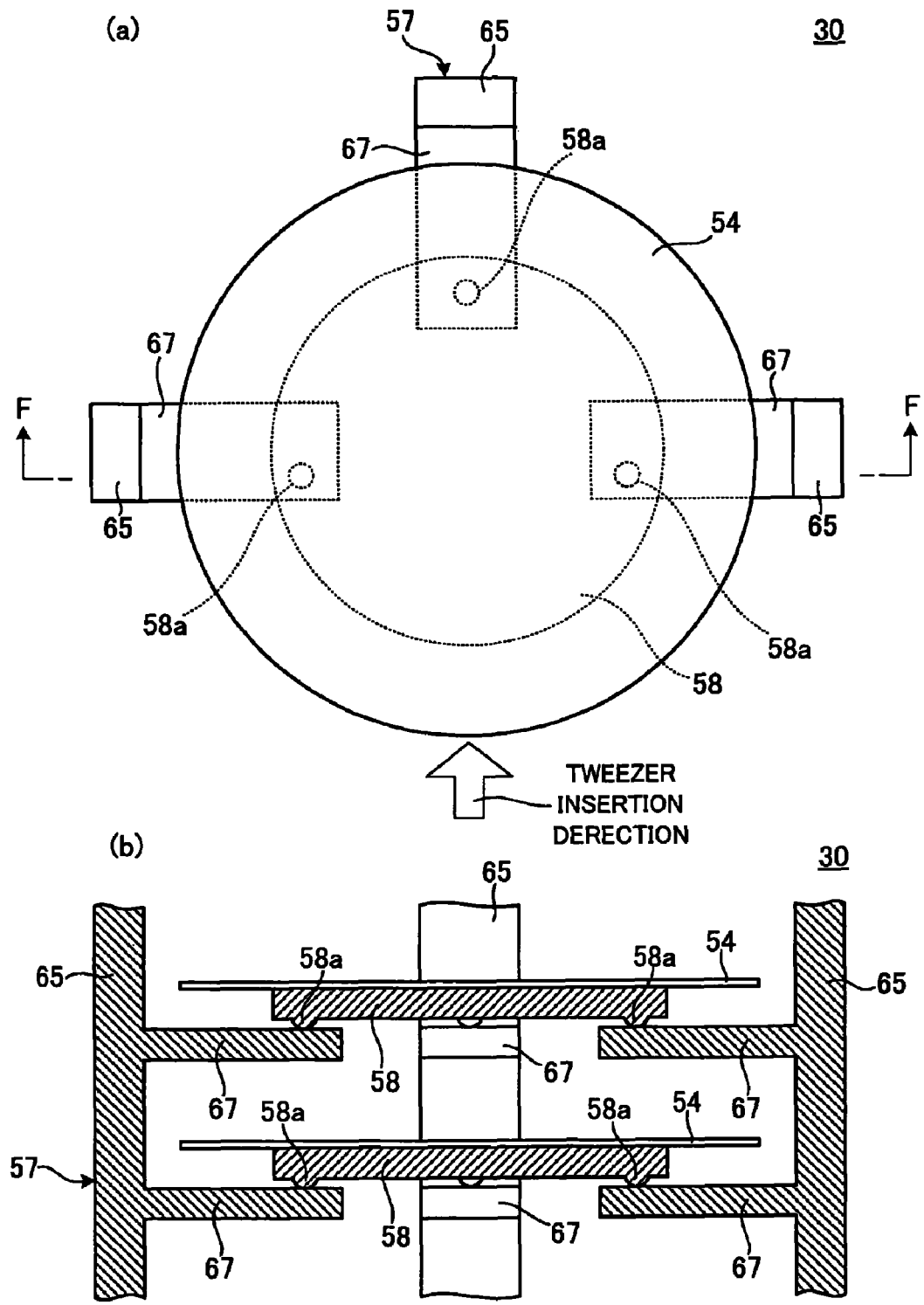
FIG. 8 is a view showing a substrate support tool (modification 5) according to the embodiment of the invention, wherein (a) is a plane view, and (b) is a cross section view along a line F-F.

Next, a fifth modification is described according to FIG. 8.

FIG. 8 shows a schematic view of a support tool 30 of the fifth modification. FIG. 8(*a*) is a plane view of a part of the support tool 30, and FIG. 8(*b*) is a cross section view along a line F-F of FIG. 8(*a*).

As shown in FIG. 8, convex portions (projections) 58*a*, 58*a*, 58*a* in an approximate semispherical shape are provided on a back (bottom) of a support part 58 in portions corresponding to support strips (claws) 67, 67, 67. The semispherical convex portions 58*a*, 58*a*, 58*a* are disposed such that they are not contacted to the edges of the support strips 67, 67, 67, and contacted to the support strips 67, 67, 67 at the inner side with respect to the edges of the support strips 67, 67, 67. To prevent drop of the support part 58, among the semispherical convex portions 58*a*, 58*a*, 58*a*, two convex portions 58*a*, 58*a* situated at a substrate insertion side are disposed in the substrate insertion side with respect to center lines of tops of support strips 67, 67 corresponding to respective convex portions 58*a*, 58*a*.

According to such a structure, the support part 58 is not contacted to the edges of the support strips 67, 67, 67, and contacted to the support strips 67, 67, 67 at the inner sides with respect to the edges of the support strips 67, 67, 67. Consequently, even if particles are produced by the rubbing action between the convex portions 58*a*, 58*a*, 58*a* of the support part 58 and the tops of the support strips 67, 67, 67, the particles are received by the tops of the support strips 67, 67, 67. Therefore, produced particles can be prevented from dropping onto a downward substrate 54.

In the fifth modification, only the back of the support part 58 can be subjected to machining (for providing convex portions), and the tops of the support strips 67, 67, 67 need not be subjected to machining (for providing convex portions or concave portions). It is difficult to perform machining to the support strips 67, 67, 67, that is, a body part 57 of the support tool 30, and particularly difficult to provide convex portions in the SiC support strips 67, 67, 67 (body part 57) as in the embodiment. Therefore, even if machining can be performed, cost may be increased. On the contrary, the support part 58 can be comparatively easily subjected to machining such as providing convex portions or concave portions, particularly in the Si support part 58 as in the embodiment. Therefore, production cost can be decreased, which may be economically (costly) advantageous.

Figure 9:
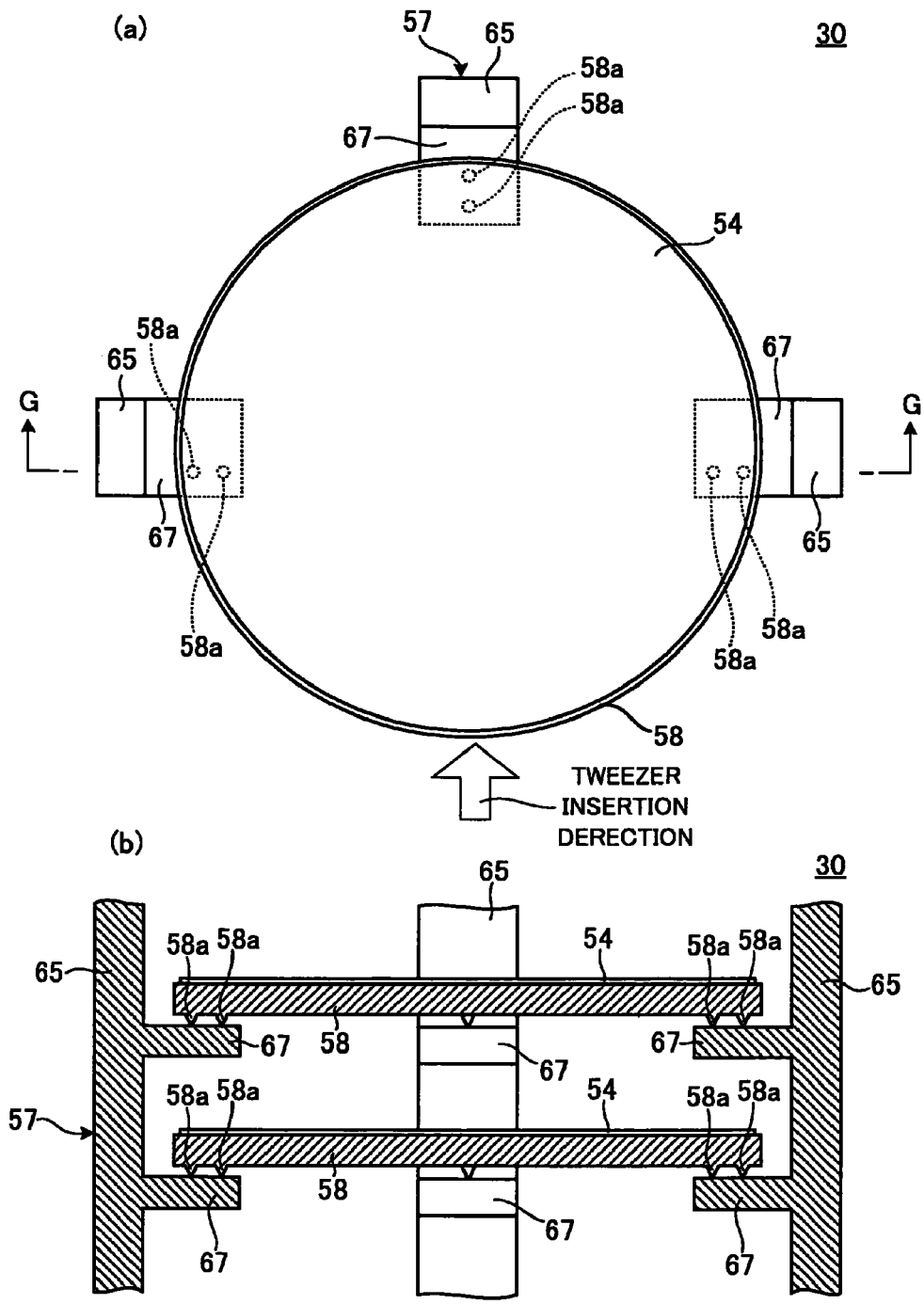
FIG. 9 is a view showing a substrate support tool (modification 6) according to the embodiment of the invention, wherein (a) is a plane view, and (b) is a cross section view along a line G-G.

Next, a sixth modification is described according to FIG. 9.

FIG. 9 shows a schematic view of a support tool 30 of the sixth modification. FIG. 9(*a*) is a plane view of a part of the support tool 30, and FIG. 9(*b*) is a cross section view along a line G-G of FIG. 9(*a*).

As shown in FIG. 9, diameter of a support part 58 is larger than diameter of a substrate 54, that is, a top of the support part 58 has larger area than a flat surface as a bottom of the substrate 54, and the substrate 54 is supported by the support part 58. For example, six convex portions (projections) 58*a* in a conical shape are provided on a back (bottom) of the support part 58 in portions corresponding to support strips (claws) 67, 67, 67. For example, two conical convex portions 58*a* are provided in a portion corresponding to one support strip 67. The six convex portions 58*a* are disposed such that they are not contacted to edges of the support strips 67, 67, 67, and contacted to tops of the support strips 67, 67, 67 at inner sides with respect to the edges of the support strips 67, 67, 67.

The convex portions 58*a* of the support part 58 may be provided singly or plurally for one support strip 67. To prevent drop of the support part 58, among the conical, six convex portions 58*a*, four convex portions 58*a* situated at a substrate insertion side are disposed in the substrate insertion side with respect to center lines of tops of support strips 67, 67 corresponding to respective four (two sets of) convex portions 58*a*.

According to such a structure, the support part 58 is not contacted to the edges of the support strips 67, 67, 67, and contacted to the support strips 67, 67, 67 at the inner sides with respect to the edges of the support strips 67, 67, 67. Consequently, even if particles are produced by the rubbing action between the six convex portions 58*a* of the support part 58 and the tops of the support strips 67, 67, 67, the particles are received by the tops of the support strips 67, 67, 67. Therefore, produced particles can be prevented from dropping onto a downward substrate 54.

In the sixth modification, only the back of the support part 58 can be subjected to machining (for providing convex portions), and the tops of the support strips 67, 67, 67 need not be subjected to machining (for providing convex portions or concave portions). It is difficult to perform machining to the support strips 67, 67, 67, that is, a body part 57 of the support tool 30, and particularly difficult to provide convex portions in the SiC support strips 67, 67, 67 (body part 57) as in the embodiment. Therefore, even if machining can be performed, cost may be increased. On the contrary, the support part 58 can be comparatively easily subjected to machining such as providing convex portions or concave portions, particularly in the Si support part 58 as in the embodiment. Therefore, production cost can be decreased, which may be economically (costly) advantageous.

Figure 10:
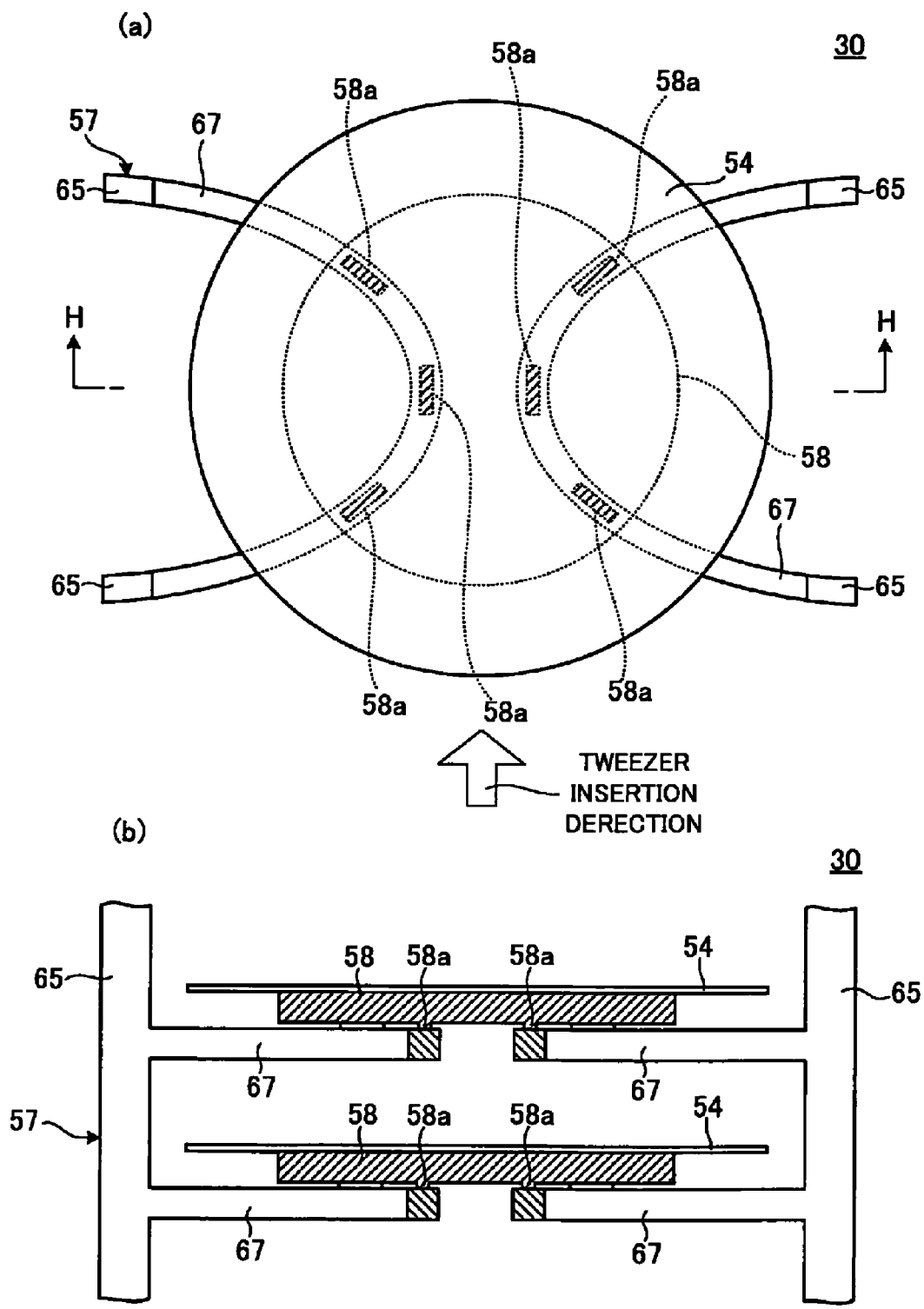
FIG. 10 is a view showing a substrate support tool (modification 7) according to the embodiment of the invention, wherein (a) is a plane view, and (b) is a cross section view along a line H-H.

Next, a seventh modification is described according to FIG. 10.

FIG. 10 shows a schematic view of a support tool 30 of the seventh modification. FIG. 10(*a*) is a plane view of a part of the support tool 30, and FIG. 10(*b*) is a cross section view along a line H-H of FIG. 10(*a*).

As shown in FIG. 10, the support tool 30 includes a body part 57 and a support part 58. The body part 57 has a disk-like upper plate (shown in FIG. 1), a similarly disk-like lower plate 63 (shown in FIG. 1), and, for example, four struts 65, 65, 65, 65 for connecting between the upper plate 61 and the lower plate 63, and support strips (claws) 67, 67 extending from the struts 65, 65, 65, 65. The struts 65, 65, 65, 65 are formed in diagonal positions such that they form a quadrilateral in a top view direction, and two struts are provided at the insertion side of the tweezer 32, and two struts are provided at a side opposite to the insertion side of the tweezer 32. The support strips 67, 67 are formed such that they form an approximately semi-elliptic shape in the top view direction respectively, and both ends of the support strips 67, 67 are formed integrally with the struts 65, 65 in a pair (two for each) on either side in view in an insertion direction of the tweezer 32. That is, in the view in the insertion direction of the tweezer 32, both ends of a support strip 67 on the left are provided such that they are unified with a strut 65 at a tweezer insertion side on the left and a strut 65 at a side opposite to the tweezer insertion side on the left respectively, and both ends of a support strip 67 on the right are provided such that they are unified with a strut 65 at a tweezer insertion side on the right and a strut 65 at a side opposite to the tweezer insertion side on the right respectively. The struts 65, 65 and the support strip 67 are formed in one by cutting a hollow, approximately semi-elliptic cylindrical member into a comb shape with portions to be the struts 65, 65 and a portion to be the support strip 67 being left.

As shown in FIG. 10, for example, six convex portions (projections) 58a are provided on a back (bottom) of the support part 58 in portions corresponding to the support strips 67, 67. For example, three convex portions 58a are provided in a portion corresponding to one support strip 67. In FIG. 10, they are provided at three places of a place in a tweezer insertion side, a place in a side opposite to the tweezer insertion side, and a place in an intermediate portion between them. The six convex portions 58a are disposed such that they are not contacted to edges of the support strips 67, 67, and contacted to tops of the support strips 67, 67 at inner than the edges of the support strips 67, 67. Hatching areas in FIG. 10(a) indicate contact portions of the support part 58 (six convex portions 58a) to the support strips 67, 67.

According to such a structure, the support part 58 is not contacted to the edges of the support strips 67, 67, and contacted to the support strips 67, 67 at the inner sides with respect to the edges of the support strips 67, 67. Consequently, even if particles are produced by the rubbing action between the six convex portions 58a of the support part 58 and the tops of the support strips 67, 67, the particles are received by the tops of the support strips 67, 67. Therefore, produced particles can be prevented from dropping onto a downward substrate 54.

In the seventh modification, only the back of the support part 58 can be subjected to machining (for providing convex portions), and the tops of the support strips 67, 67 need not be subjected to machining (for providing convex portions or concave portions). It is difficult to perform machining to the support strips 67, 67, that is, the body part 57 of the support tool 30, and particularly difficult to provide convex portions in the SiC support strips 67, 67 (body part 57) as in the embodiment. Therefore, even if machining can be performed, cost may be increased. On the contrary, the support part 58 can be comparatively easily subjected to machining such as providing convex portions or concave portions, particularly in the Si support part 58 as in the embodiment. Therefore, production cost can be decreased, which may be economically (costly) advantageous.

Figure 11:
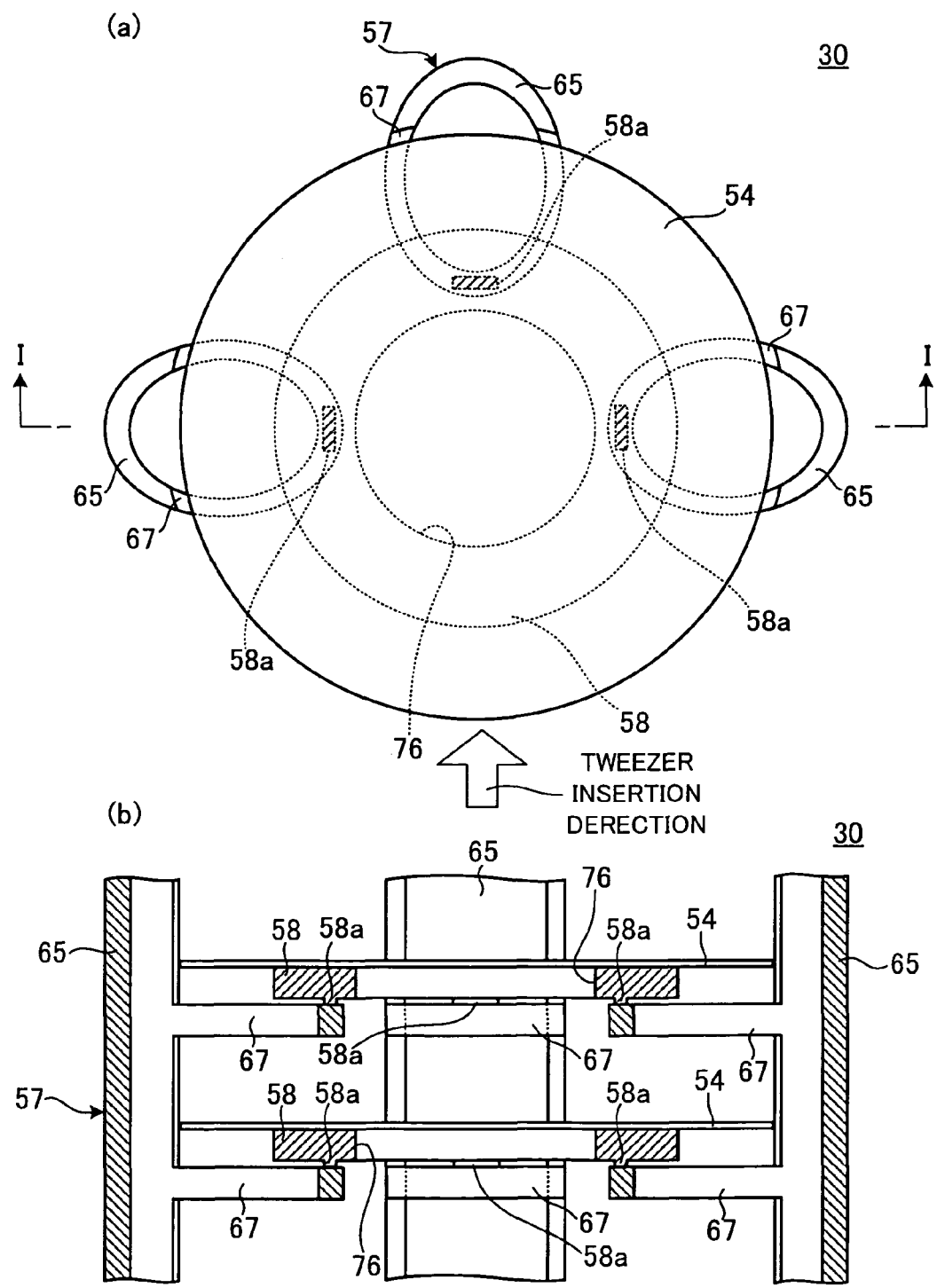
FIG. 11 is a view showing a substrate support tool (modification 8) according to the embodiment of the invention, wherein (a) is a plane view, and (b) is a cross section view along a line I-I.

Next, an eighth modification is described according to FIG. 11.

FIG. 11 shows a schematic view of a support tool 30 of the eighth modification. FIG. 11(a) is a plane view of a part of the support tool 30, and FIG. 11(b) is a cross section view along a line I-I of FIG. 11(a).

As shown in FIG. 11, the support tool 30 includes a body part 57 and a support part 58. The body part 57 has a disk-like upper plate (shown in FIG. 1), a similarly disk-like lower plate 63 (shown in FIG. 1), and, for example, three struts 65, 65, 65 for connecting between the upper plate 61 and the lower plate 63, and support strips (claws) 67, 67, 67 extending from the struts 65, 65, 65. The struts 65, 65, 65 are formed with an interval of 90 degrees from one another, and two struts are provided with an interval of 180 degrees at a tweezer 32 insertion side, and provided in one at a side opposite to the tweezer insertion side. The support strips 67, 67, 67 and the struts 65, 65, 65 are formed such that they form an elliptic ring shape in a top view direction, and the support strips 67, 67, 67, which form part of the elliptic ring shape, extend in a horizontal direction from the struts 65, 65, 65, which form part of the elliptic ring shape as well. The strut 65 and the support strip 67 are formed in one by cutting a hollow, elliptic cylindrical member into a comb shape with a portion to be the strut 65 and a portion to be the support strip 67 being left.

The support part 58 is formed in a disk shape (cylindrical shape), and in the center of the support part, a through-hole 76 penetrating from a top of the support part 58 to a bottom of the support part 58 is formed, consequently the support part 58 is in a ring shape. In this way, the support part 58 may be a ring-shaped member.

As shown in FIG. 11, convex portions (projections) 58a, 58a, 58a are provided on a back (bottom) of the support part 58 in portions corresponding to the support strips 67, 67, 67. The convex portions 58a, 58a, 58a are disposed such that they are not contacted to edges of the support strips 67, 67, 67, and contacted to tops of the support strips 67, 67, 67 at inner sides with respect to the edges of the support strips 67, 67, 67. Hatching areas in FIG. 11(a) indicate contact portions of the support part 58 (convex portions 58a, 58a, 58a) to the support strips 67, 67, 67.

According to such a structure, the support part 58 is not contacted to the edges of the support strips 67, 67, 67 and contacted to the support strips 67, 67, 67 at the inner sides with respect to the edges of the support strips 67, 67, 67. Consequently, even if particles are produced by the rubbing action between the convex portions 58a, 58a, 58a of the support part 58 and the tops of the support strips 67, 67, 67, the particles are received by the tops of the support strips 67, 67, 67. Therefore, produced particles can be prevented from dropping onto a downward substrate 54.

In the eighth modification, only the back of the support part 58 can be subjected to machining (for providing convex portions), and the tops of the support strips 67, 67, 67 need not be subjected to machining (for providing convex portions or concave portions). It is difficult to perform machining to the support strips 67, 67, 67, that is, the body part 57 of the support tool 30, and particularly difficult to provide convex portions in the SiC support strips 67, 67, 67 (body part 57) as in the embodiment. Therefore, even if machining can be performed, cost may be increased. On the contrary, the support part 58 can be comparatively easily subjected to machining such as providing convex portions or concave portions, particularly in the Si support part 58 as in the embodiment.

Therefore, production cost can be decreased, which may be economically (costly) advantageous.

Figure 12:
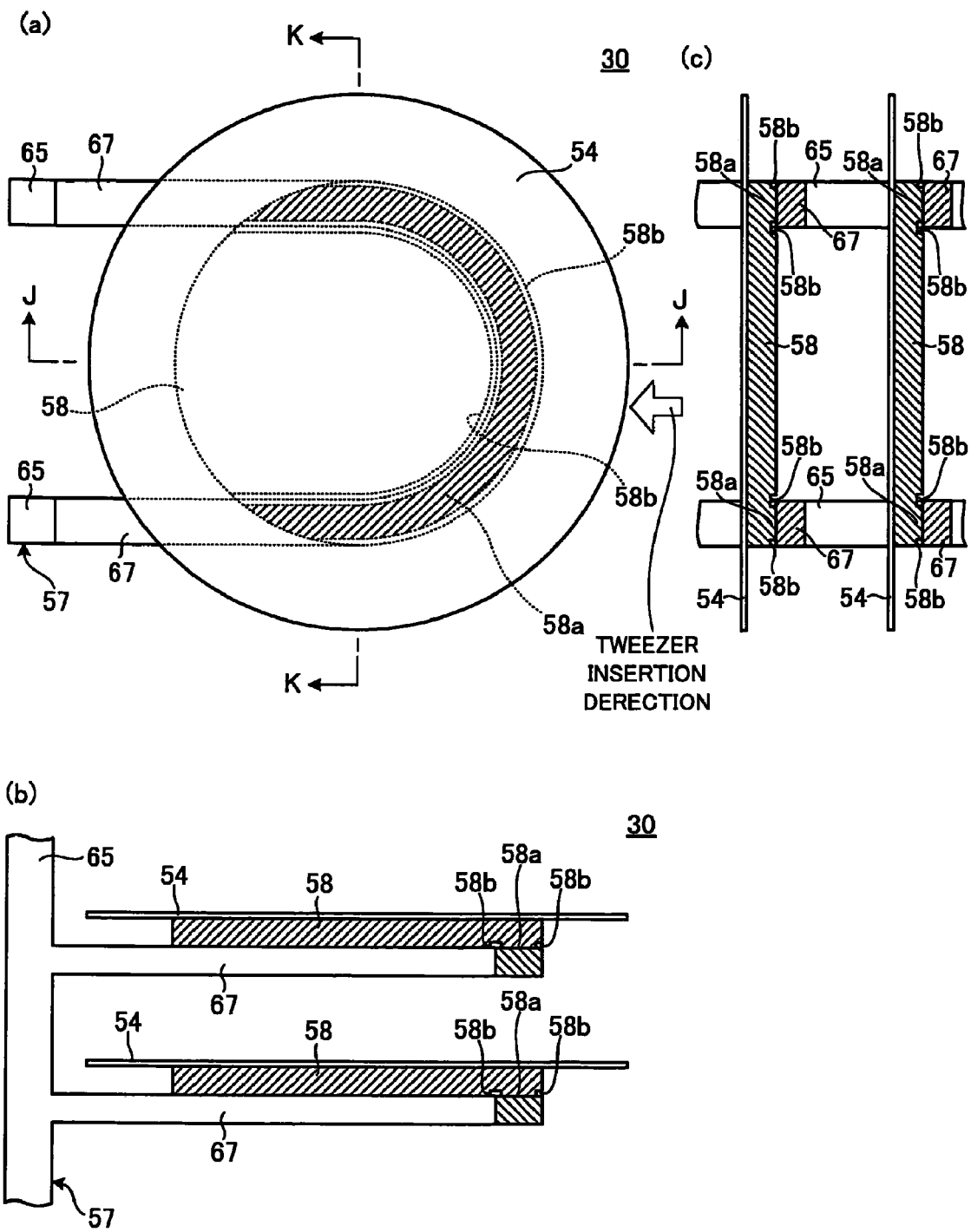
FIG. 12 is a view showing a substrate support tool (modification 9) according to the embodiment of the invention, wherein (a) is a plane view, (b) is a cross section view along a line J-J, and (c) is a cross section view along a line K-K.

Next, a ninth modification is described according to FIG. 12.

FIG. 12 shows a schematic view of a support tool 30 of the ninth modification. FIG. 12(a) is a plane view of a part of the support tool 30, FIG. 12(b) is a cross section view along a line J-J of FIG. 12(a), and FIG. 12(c) is a cross section view along a line K-K of FIG. 12(a).

As shown in FIG. 12, the support tool 30 includes a body part 57 and a support part 58. The body part 57 has a disk-like upper plate (shown in FIG. 1), a similarly disk-like lower plate 63 (shown in FIG. 1), and, for example, two struts 65, 65 for connecting between the upper plate 61 and the lower plate 63, and a support strip (claw) 67 extending from the struts 65, 65. The struts 65, 65 are provided at a side opposite to an insertion side of a tweezer 32. The support strip 67 (claw) is formed such that it forms a horseshoe shape in a top view direction, and both ends of the support strip 67 are formed to be united with the struts 65, 65 respectively.

In portions of a back (bottom) of the support part 58 corresponding to edges, that is, an outer edge and an inner edge of the support strip 67, two concave portions (grooves) 58b, 58b are provided to avoid contact between the support part 58 and the edges of the support strip 67. The concave portions 58b, 58b are formed on the back of the support part 58 in a manner of rimming edges of a front end of the support strip 67. The concave portions 58b, 58b are formed such that they form a U-shape in a bottom view direction. The two concave portions 58b, 58b are provided on the back of the support part 58, thereby a convex portion 58a projected from bottoms of the concave portions 58b, 58b is automatically formed in an area sandwiched between the two concave portions 58b, 58b. The convex portion 58a is contacted to a top of the support strip 67. The convex portion 58a is formed such that it forms a U-shape in a bottom view direction. The convex portion 58 is disposed such that it is not contacted to the edges of the support strip 67, and contacted to the top of the support strip 67 at inner than the edges of the support strip 67. Hatching areas in FIG. 12(a) indicate contact portions of the support part 58 (convex portions 58a) to the support strip 67.

According to such a structure, the support part 58 is not contacted to the edges of the support strip 67 and contacted to the support strip 67 at the inner side with respect to the edges of the support strips 67. Consequently, even if particles are produced by the rubbing action between the convex portion 58a of the support part 58 and the top of the support strip 67, the particles are received by the top of the support strips 67. Therefore, produced particles can be prevented from dropping onto a downward substrate 54.

In the ninth modification, only the back of the support part 58 can be subjected to machining (for providing concave portions), and the top of the support strips 67 need not be subjected to machining (for providing a convex portion or a concave portion). It is difficult to perform machining to the support strip 67, that is, the body part 57 of the support tool 30, and particularly difficult to provide a convex portion in the SiC support strip 67 (body part 57) as in the embodiment. Therefore, even if machining can be performed, cost may be increased. On the contrary, the support part 58 can be comparatively easily subjected to machining such as providing a convex portion or a concave portion, particularly in the Si support part 58 as in the embodiment. Therefore, production cost can be decreased, which may be economically (costly) advantageous.

Figure 13:
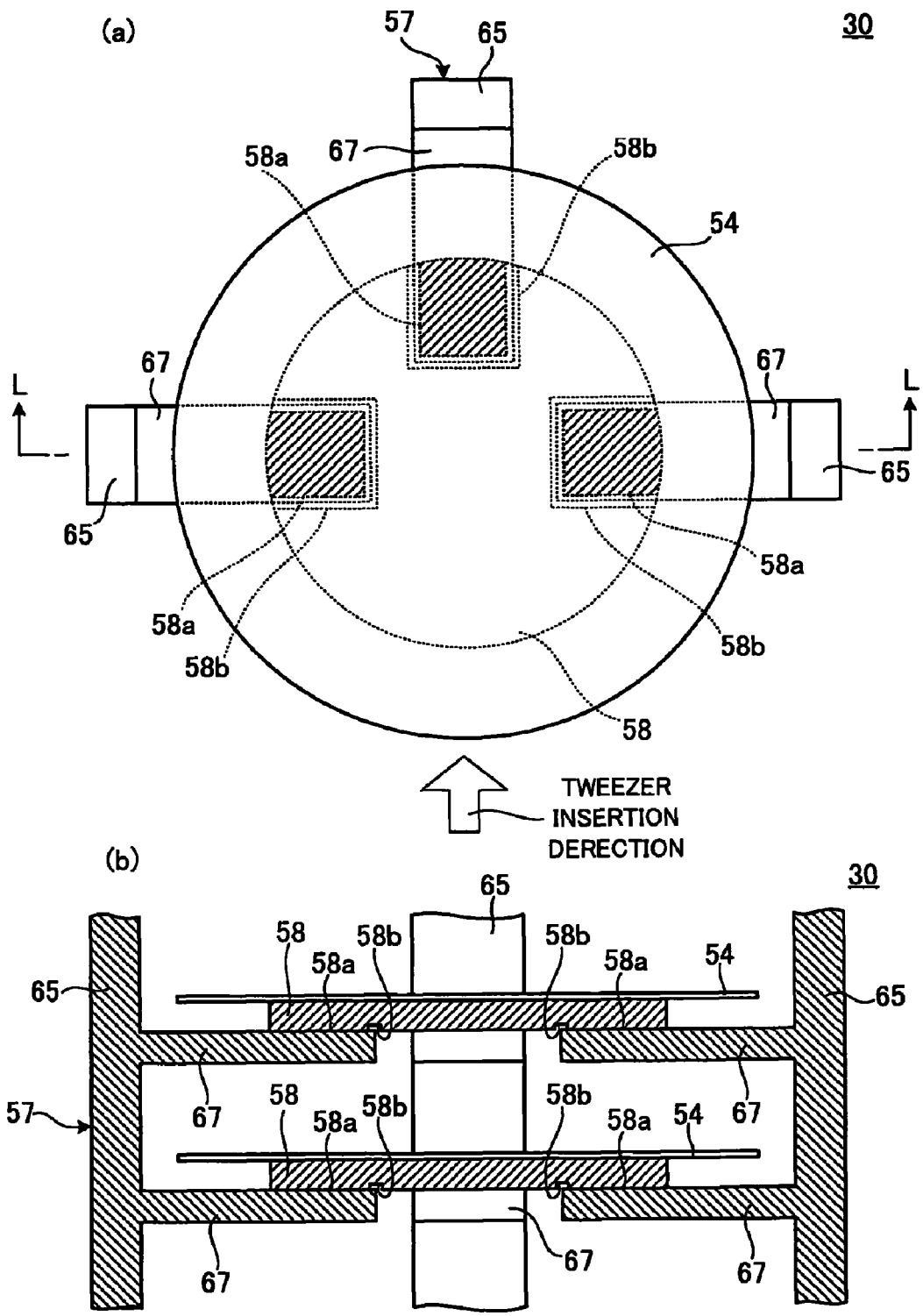
FIG. 13 is a view showing a substrate support tool (modification 10) according to the embodiment of the invention, wherein (a) is a plane view, and (b) is a cross section view along a line L-L.

Next, a tenth modification is described according to FIG. 13.

FIG. 13 shows a schematic view of a support tool 30 of the tenth modification. FIG. 13(a) is a plane view of a part of the support tool 30, and FIG. 13(b) is a cross section view along a line L-L of FIG. 13(a).

As shown in FIG. 13, in portions of a back (bottom) of a support part 58, corresponding to edges of support strips 67, 67, 67, concave portions (grooves) 58b, 58b, 58b are provided to avoid contact between the support part 58 and edges of the support strips (claws) 67, 67, 67. The concave portions 58b, 58b, 58b are formed in a manner of rimming respective edges of front ends of the support strips 67, 67, 67. The concave portions 58b, 58b, 58b are formed such that they form a U-shape in a bottom view direction respectively. The concave portions 58b, 58b, 58b are provided on the back of the support part 58, thereby convex portions 58a, 58a, 58a projected from bottoms of the concave portions 58b, 58b, 58b are automatically formed in respective areas enclosed by the U-shaped concave portions 58b, 58b, 58b. The convex portions 58a, 58a, 58a are contacted to tops of the support strips 67, 67, 67. The convex portions 58a, 58a, 58a are disposed such that they are not contacted to the edges of the support strips 67, 67, 67, and contacted to the tops of the support strips 67, 67, 67 at inner than the edges of the support strips 67, 67, 67. Hatching areas in FIG. 13(a) indicate contact portions of the support part 58 (convex portions 58a, 58a, 58a) to the support strips 67, 67, 67.

According to such a structure, the support part 58 is not contacted to the edges of the support strips 67, 67, 67 and contacted to the support strips 67, 67, 67 at the inner side with respect to the edges of the support strips 67, 67, 67. Consequently, even if particles are produced by the rubbing action between the convex portions 58a, 58a, 58a of the support part 58 and the tops of the support strips 67, 67, 67, the particles are received by the tops of the support strips 67, 67, 67. Therefore, produced particles can be prevented from dropping onto a downward substrate 54.

In the tenth modification, only the back of the support part 58 can be subjected to machining (for providing concave portions), and the tops of the support strips 67, 67, 67 need not be subjected to machining (for providing convex portions or concave portions). It is difficult to perform machining to the support strips 67, 67, 67, that is, the body part 57 of the support tool 30, and particularly difficult to provide a convex portion in the SiC support strips 67, 67, 67 (body part 57) as in the embodiment. Therefore, even if machining can be performed, cost may be increased. On the contrary, the support part 58 can be comparatively easily subjected to machining such as providing convex portions or concave portions, particularly in the Si support part 58 as in the embodiment. Therefore, production cost can be decreased, which may be economically (costly) advantageous.

Figure 14:
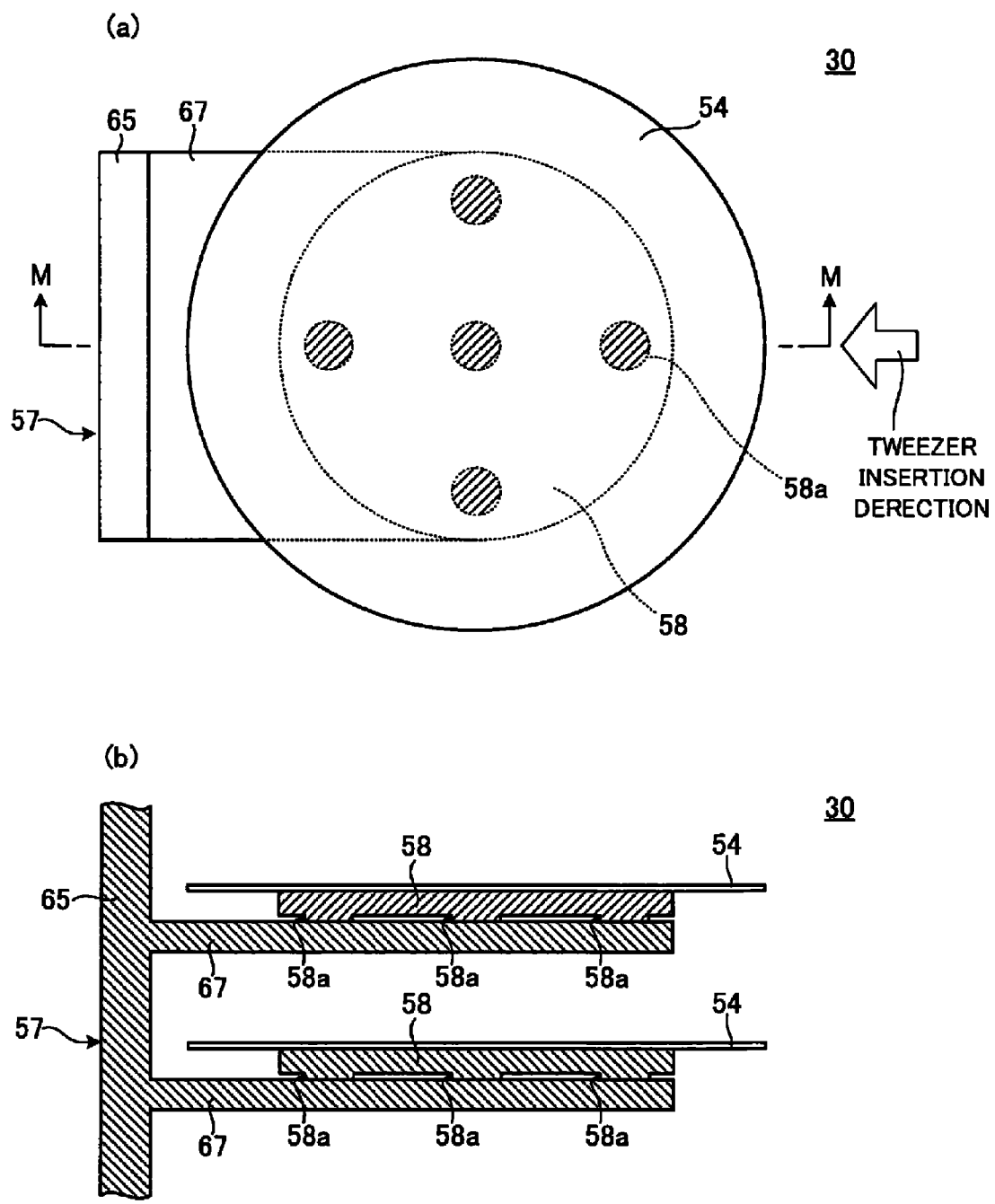
FIG. 14 is a view showing a substrate support tool (modification 11) according to the embodiment of the invention, wherein (a) is a plane view, and (b) is a cross section view along a line M-M.

Next, an eleventh modification is described according to FIG. 14.

FIG. 14 shows a schematic view of a support tool 30 of the eleventh modification. FIG. 14(a) is a plane view of a part of the support tool 30, and FIG. 14(b) is a cross section view along a line M-M of FIG. 14(a).

As shown in FIG. 14, the support tool 30 includes a body part 57 and a support part 58. The body part 57 has a disk-like upper plate (shown in FIG. 1), a similarly disk-like lower plate 63 (shown in FIG. 1), a strut 65 for connecting between the upper plate 61 and the lower plate 63, and a support strip (claw) 67 extending from the strut 65. The strut 65 is formed to have width equal to diameter of the support part 58 in a top view direction, and provided at a side opposite to an insertion side of a tweezer 32. The support strip 67 extends in a horizontal direction from the strut 65, and the support strip 67 is formed to have, for example, the same width as width of the support part 58 in the top view direction, and a front end portion of the support strip 67 is formed to be in a semicircular shape along an outer circumferential edge of the support part 58.

The support part 58 is formed to be in a disk shape (cylindrical shape), and diameter of the support part 58 is, for example, equal to width of the support strip 67. Accordingly, area of a portion where a top of the support strip 67 is opposed to the support part 58 (overlapped portion of them in view from above) is the same as area of a back of the support part 58. In this way, the area of the portion where the top of the support strip 67 is opposed to the support part 58 (overlapped portion of them in view from above) may be the same as area of the back of the support part 58.

In portions of the back (bottom) of the support part 58 corresponding to the support strip 67, for example, five concave portions (grooves) 58a are provided to avoid contact to an outer circumferential edge of the support strip 67. In the concave portions 58a, one concave portion is formed in a central portion, and four concave portions are formed in an inner side (near the central portion) with respect to an outer circumferential edge of the support strip 67 with an interval of 90 degrees from one another. That is, the five concave portions 58a are disposed such that they are contacted to the top of the support strip 67 at the inner side with respect to the edge of the support strip 67. Hatching areas in FIG. 14(a) indicate contact portions of the support part 58 (five convex portions 58a) to the support strip 67.

According to such a structure, the support part 58 is not contacted to the edge of the support strip 67 and contacted to the support strip 67 at the inner side with respect to the edge of the support strip 67. Consequently, even if particles are produced by the rubbing action between the five convex portions 58a of the support part 58 and the top of the support strip 67, the particles are received by the top of the support strip 67. Therefore, produced particles can be prevented from dropping onto a downward substrate 54.

In the eleventh modification, only the back of the support part 58 can be subjected to machining (for providing convex portions), and the top of the support strip 67 need not be subjected to machining (for providing a convex portion or a concave portion). It is difficult to perform machining to the support strip 67, that is, the body part 57 of the support tool 30, and particularly difficult to provide a convex portion in the SiC support strip 67 (body part 57) as in the embodiment. Therefore, even if machining can be performed, cost may be increased. On the contrary, the support part 58 can be comparatively easily subjected to machining such as providing a convex portion or a concave portion, particularly in the Si support part 58 as in the embodiment. Therefore, production cost can be decreased, which may be economically (costly) advantageous.

Figure 15:
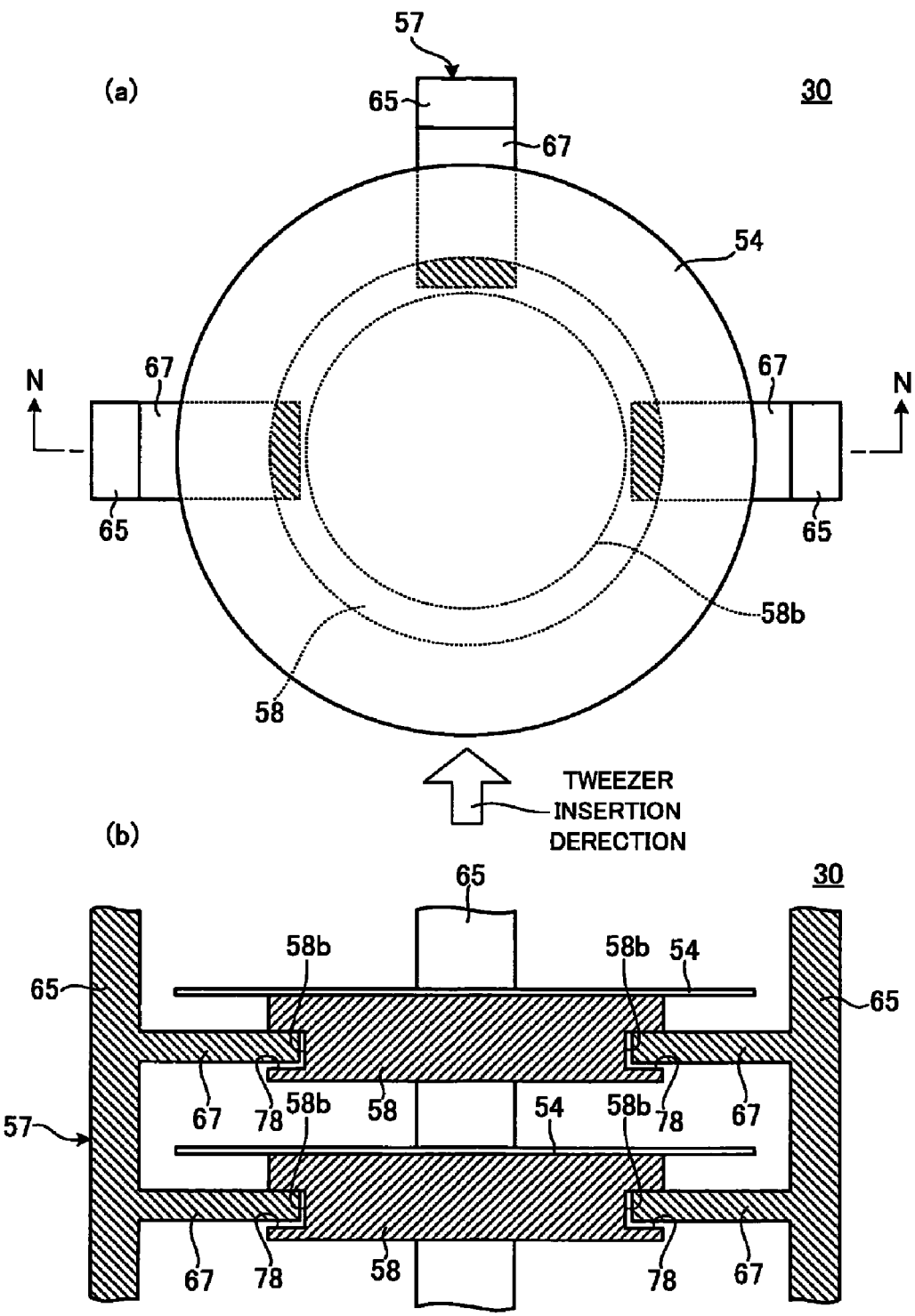
FIG. 15 is a view showing a substrate support tool (modification 12) according to the embodiment of the invention, wherein (a) is a plane view, and (b) is a cross section view along a line N-N.

Next, a twelfth modification is described according to FIG. 15.

FIG. 15 shows a schematic view of a support tool 30 of the twelfth modification. FIG. 15(a) is a plane view of a part of the support tool 30, and FIG. 15(b) is a cross section view along a line N-N of FIG. 15(a).

As shown in FIG. 15, in portions of a side face (outer circumferential face) of a support part 58 corresponding to support strips (claws) 67, 67, 67, a concave portion (groove) 58b having a fixed depth in a horizontal direction is provided. The concave portion 58b is formed in the outer circumferential face as a whole of the support part 58, and a receiving part 78 is formed in a lower part in a vertical direction of the concave portion 58b. A space is provided between the receiving part 78 and the support strips 67, 67, 67, so that a top of the receiving part 78 is not contacted to backs of the support strips 67, 67, 67. That is, width (in the vertical direction) of the concave portion 58b is formed large compared with thickness of the support strips 67, 67, 67 (in the vertical direction). Furthermore, the concave portion 58 is formed deep (large) in a center direction of diameter of the support part 58, so that end faces of front ends of the support strips 67, 67, 67 is not contacted to a bottom in a depth direction of the concave portion 58b even in depth of the concave portion 58b (in a horizontal direction). That is, diameter of the concave portion 58b of the support part 58 is formed small compared with a distance between opposed, two support strips 67, 67. Hatching areas in FIG. 15(a) indicate contact portions of the support part 58 (concave portion 58b) to the support strips 67, 67, 67.

Thus, even if particles are produced by the rubbing action between the concave portion 58b of the support part 58 and tops of the support strips 67, 67, 67, the particles are received by the receiving part 78 of the concave portion 58a of the support part 58. Therefore, produced particles can be prevented from dropping onto a downward substrate 54.

In the twelfth modification, only the side face of the support part 58 can be subjected to machining (for providing a concave portion), and the tops of the support strips 67, 67, 67 need not be subjected to machining (for providing a convex portion or a concave portion). It is difficult to perform machining to the support strips 67, 67, 67, that is, the body part 57 of the support tool 30, and particularly difficult to provide a convex portion in the SiC support strips 67, 67, 67 (body part 57) as in the embodiment. Therefore, even if machining can be performed, cost may be increased. On the contrary, the support part 58 can be comparatively easily subjected to machining such as providing a convex portion or a concave portion, particularly in the Si support part 58 as in the embodiment. Therefore, production cost can be decreased, which may be economically (costly) advantageous.

The invention is not limited to the above embodiment and modifications, and can be variously altered or modified and used.

Figure 16:
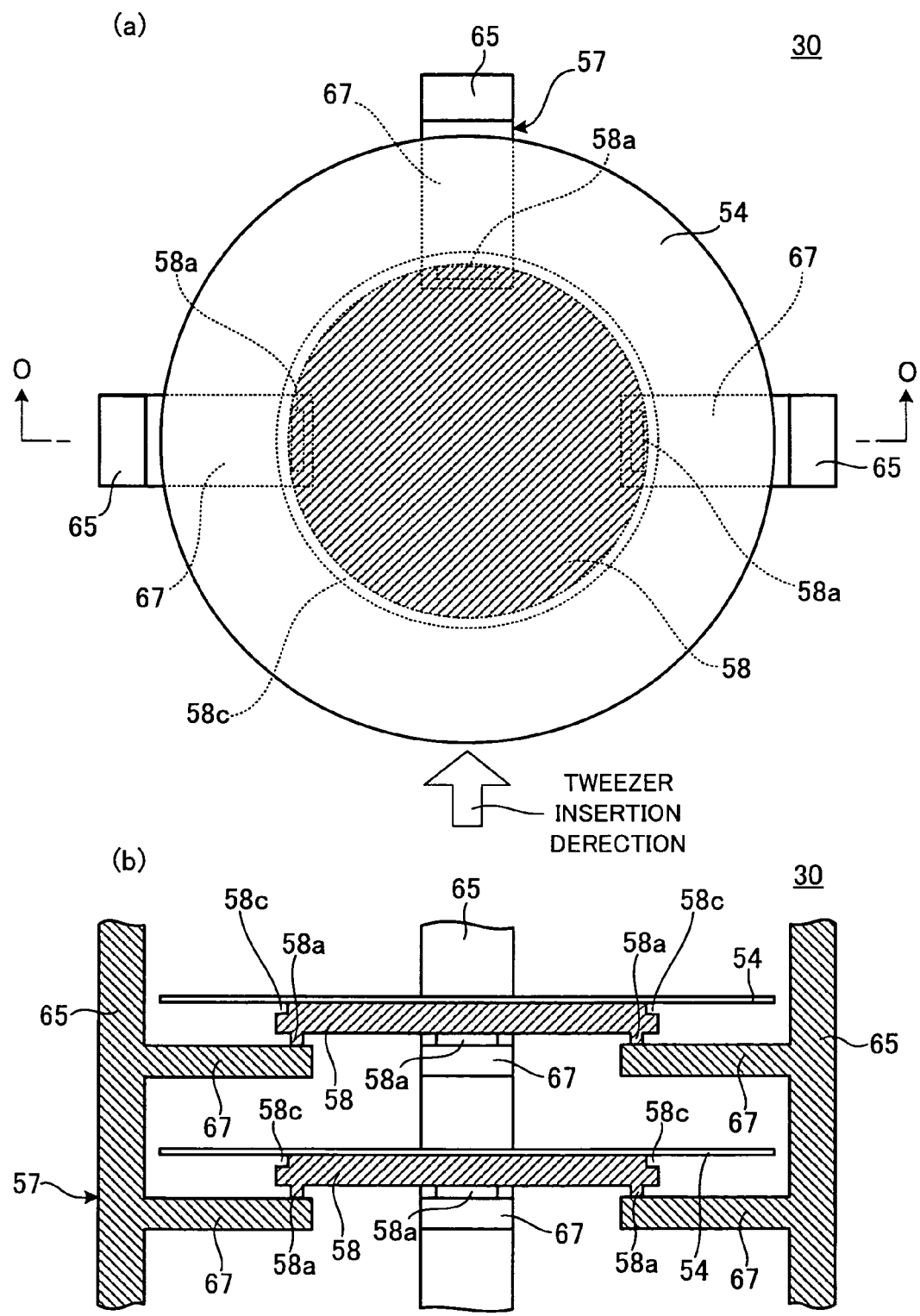
FIG. 16 is a view showing another modification (application example) of the substrate support tool according to the embodiment of the invention, wherein (a) is a plane view, and (b) is a cross section view along a line O-O.

For example, as shown in FIG. 16, facing 58c as a concave portion may be provided in an outer circumferential edge portion of the top of the support part 58 in the embodiment (FIG. 3), so that the substrate 54 is not contacted to an edge of the support part 58, and contacted to the support part 58 at the inner side of the edge of the support part 58.

Figure 17:
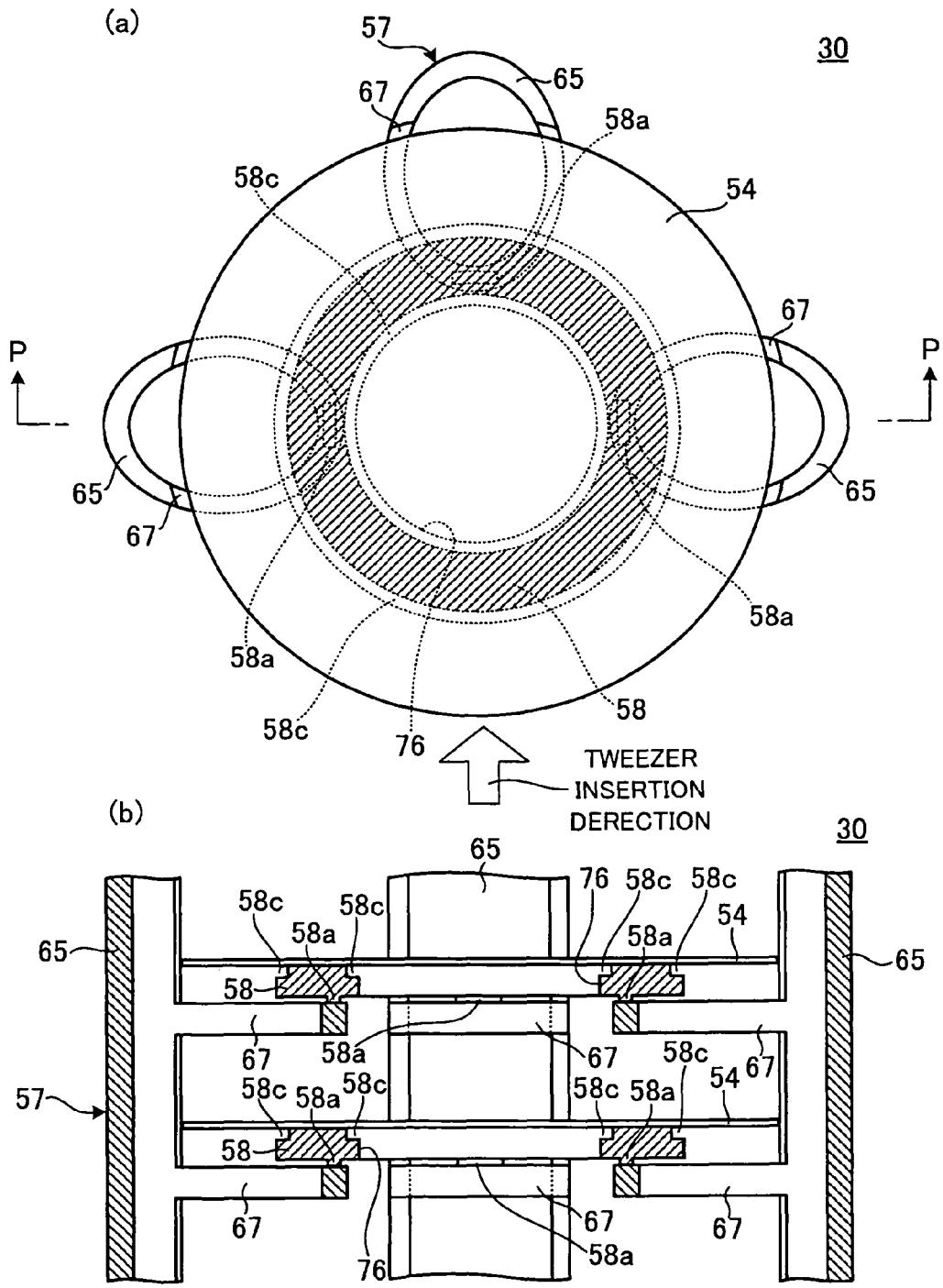
FIG. 17 is a view showing still another modification (application example) of the substrate support tool according to the embodiment of the invention, wherein (a) is a plane view, and (b) is a cross section view along a line P-P.

Moreover, as shown in FIG. 17, facing 58c as concave portions may be provided in respective portions of an outer circumferential edge and an inner circumferential edge of the top of the ring-shaped support part 58 in the eighth modification (FIG. 11), so that the substrate 54 is not contacted to the edges of the support part 58, and contacted to the support part 58 at the inner side with respect to the edges of the support part 58.

Here, the edge of the support part 58 means a visible outline (profile) of the support part 58 in view in a vertical direction. Hereinafter, the term is used in the same meaning.

According to this, it is enabled that area of a contact surface of a contact portion of the support part 58 to the substrate 54 is small compared with area of an overlapped portion of the support part 58 with the substrate 54 in view in a vertical direction, and an end of the contact surface of the support part 58 to the substrate 54 is situated at the inner side with respect to the edges of the support part 58.

Hatching areas in FIG. 16(a) and FIG. 17(a) indicate contact portions of the substrate 54 to the support part 58.

According to such a structure, even if particles are produced at the end of the contact surface of the support part 58 to the substrate 54, the particles are captured by the facing 58c of the support part 58, and therefore can be prevented from dropping onto a surface of a substrate 54 situated below the facing. That is, according to such a structure, particles produced by the rubbing action between the support part 58 and the support strips 67, 67, 67 can be prevented from dropping onto the substrate 54, in addition, particles produced by the rubbing action between the support part 58 and a substrate 54 can be also prevented from dropping onto a substrate 54.

The embodiment and modifications can be approximately combined for use.

While a batch-type apparatus for heat treatment of a number of (a plurality of) substrates was used as heat treatment apparatus in the description of the embodiment and modifications, the apparatus is not limited to this, and apparatus for heat treatment of at least two substrates may be used.

The heat treatment apparatus of the invention can be also used for a manufacturing process of a substrate.

An example of using the heat treatment apparatus of the invention for a step of a manufacturing process of a SIMOX (Separation by Implanted Oxygen) wafer is described, the wafer being a type of SOI (Silicon On Insulator) wafers.

First, ion implantation of oxygen ions into a single-crystal silicon wafer is performed using ion implantation apparatus or the like. Then, the wafer implanted with the oxygen ions are annealed at high temperature of 1300° C. to 1400° C., for example, 1350° C. or more under an atmosphere of, for example, Ar and $O_2$ using the heat treatment apparatus of the embodiment. As a result of these kinds of treatment, a SIMOX wafer is prepared, in which a $SiO_2$ layer is formed (a $SiO_2$ layer is buried).

In addition to the SIMOX wafer, the heat treatment apparatus of the invention can be used for a step of a manufacturing process of a hydrogen annealing wafer or an Ar annealing wafer. In this case, the wafer is annealed at high temperature of about 1200° C. or more in a hydrogen atmosphere or an Ar atmosphere using the heat treatment apparatus of the invention. Thus, crystal defects can be reduced in a wafer surface layer in which IC (integrated circuit) is to be produced, consequently integrity of crystals can be improved.

In addition, the heat treatment apparatus of the invention can be used for a step of manufacturing process of an epitaxial wafer.

Even if the high-temperature annealing is carried out as a step of a manufacturing process of a substrate as above, drop of particles produced by the rubbing action between a support strip and a support member can be prevented by using the heat treatment apparatus of the invention.

Furthermore, the heat treatment apparatus of the invention can be used for a manufacturing process of a semiconductor device.

In particular, the apparatus is preferably used for a heat treatment process at comparatively high temperature, for example, a process of heat oxidization such as wet oxidization, dry oxidization, hydrogen combustion oxidization (pyrogenic oxidization), or HCl oxidization, and a thermal diffusion process of diffusing dopant such as boron (B), phosphorus (P), arsenic (As), or antimony (Sb) into a semiconductor film.

Even if such a heat treatment step is carried out as a step of the manufacturing process of the semiconductor device, drop of particles produced by the rubbing action between the support strip and the support member can be prevented by using the heat treatment apparatus of the invention.

INDUSTRIAL APPLICABILITY

The invention can be used for heat treatment apparatus and a manufacturing method of a substrate, which require preventing drop of particles produced by a rubbing action between a support strip and a support member.

The invention claimed is:

1. A heat treatment apparatus comprising:
a reactor for treating a substrate; and
a support tool for supporting the substrate in the reactor, the support tool comprising:
   a support part to be contacted to the substrate;
   a support strip for supporting the support part; and
   a back of the support part has a convex portion or a concave portion, and the back of the support part is configured to be not contacted to an edge of the support strip, and contacted to a top of the support strip at a location inward of the edge of the support strip, and
the concave portion is provided in a portion corresponding to the to an edge of the support part such that contact of the back of the support part to the edge of the support part is avoided.

2. A heat treatment apparatus comprising:
a reactor for treating a substrate; and
a support tool for supporting the substrate in the reactor, the support tool comprising:
   a support part to be contacted to the substrate;
   a support strip for supporting the support part; and
   a back of the support part has a convex portion or a concave portion, and the back of the support part is configured to be not contacted to an edge of the support strip, and contacted to a top of the support strip at a location inward of the edge of the support strip, and
the top of the support part has a concave portion, so that the support part is configured such that the substrate is not contacted to an edge of the support part, and contacted to the support part at a location inward of the edge of the support part, while the support part supports the substrate.

3. A heat treatment apparatus comprising:
a reactor for treating a substrate; and
a support tool for supporting the substrate in the reactor, the support tool comprising:
   a support part to be contacted to the substrate
   a support strip for supporting the support part; and
   a back of the support part has a convex portion or a concave portion, and the back of the support part is configured to be not contacted to an edge of the support strip, and contacted to a top of the support strip at a location inward of the edge of the support strip, and the support part includes a plate-like member or a ring-like member.

4. The heat treatment apparatus according to claim 3, wherein the support tool is configured in a way of supporting a plurality of substrates in a plurality of stages with a space in an approximately horizontal condition.

5. The heat treatment apparatus according to claim 3, wherein the support part includes one of silicon, silicon carbide, and quartz, and the support strip includes one of silicon, silicon carbide, and quartz.

6. The heat treatment apparatus according to claim 3, wherein the support part is made of silicon, and the support strip is made of silicon carbide.

7. The heat treatment apparatus according to claim 3, wherein a concave portion is provided on the top of the support strip, the concave portion being for storing the convex portion provided in the back of the support part.

8. A heat treatment apparatus comprising:

a reactor for treating a substrate; and a support tool for supporting the substrate in the reactor, the support tool comprising:
- a support part to be contacted to the substrate;
- a support strip for supporting the support part;
- a back of the support part has a convex portion or a concave portion, and the back of the support part is configured to be not contacted to an edge of the support strip, and contacted to a to of the support strip at a location inward of the edge of the support strip; and
- a convex portion is provided on the top of the support strip, the convex portion being to be stored by the concave portion provided in the back of the support part.

9. A heat treatment apparatus comprising:

a reactor for treating a substrate, and a support tool for supporting the substrate in the reactor, the support tool has comprising:
- a support part to be contacted to the substrate;
- a support strip for supporting the support part; and
- a spacer is provided between a back of the support part and a top of the support strip, and at a location inward of an edge of the support strip, the spacer being to be contacted to both the back of the support part and the top of the support strip.

10. The heat treatment apparatus according to claim 9:

wherein a concave portion for storing the spacer is provided in the back of the support part and the top of the support strip, or the back of the support part, or the top of the support strip.

11. A method of manufacturing a substrate, comprising:

a step of supporting a substrate by a support tool having a support part to be contacted to the substrate, and a support strip for supporting the support part, in which a back of the support part is not contacted to an edge of the support strip, and contacted to a top of the support strip at a location inward of the edge of the support, strip, and the support part includes a plate-like member or a ring-like member;

a step of carrying the substrate supported by the support tool into a reactor;

a step of performing heat treatment to a substrate supported by the support tool in the reactor; and a step of carrying out the substrate supported by the support tool from the reactor after the heat treatment.

12. A substrate treatment method, comprising:

a step of supporting a substrate by a support tool having a support part to be contacted to the substrate, and a support strip for supporting the support part, in which a back of the support part is not contacted to an edge of the support strip, and contacted to a top of the support strip at a location inward of the edge of the support strip, and the support part includes a plate-like member or a ring-like member;

a step of carrying the substrate supported by the support tool into a reactor;

a step of performing heat treatment to a substrate supported by the support tool in the reactor; and a step of carrying out the substrate supported by the support tool from the reactor after the heat treatment.

13. A method for manufacturing a semiconductor device, comprising:

a step of supporting a substrate by a support tool having a support part to be contacted to the substrate, and a support strip for supporting the support part, in which a back of the support part is not contacted to an edge of the support strip, and contacted to a top of the support strip at a location inward of the edge of the support strip, and the support part includes a plate-like member or a ring-like member;

a step of carrying the substrate supported by the support tool into a reactor;

a step of performing heat treatment to a substrate supported by the support tool in the reactor; and a step of carrying out the substrate supported by the support tool from the reactor after the heat treatment.

14. A support tool for supporting a substrate in a reactor for treating the substrate, the support tool comprising:
- a support tool has a support part to be contacted to the substrate; and
- a support strip for supporting the support part; and
- a back of the support part has a convex portion or a concave portion, and the back of the support part is configured to be not contacted to an edge of the support strip, and contacted to a top of the support strip at a location inward of the edge of the support strip, and the support part includes a plate-like member or a ring-like member.

* * * * *